US009287142B2

(12) United States Patent
Yokosawa

(10) Patent No.: US 9,287,142 B2
(45) Date of Patent: *Mar. 15, 2016

(54) METHOD OF MANUFACTURING A SEMICONDUCTOR DEVICE USING MARKINGS ON BOTH LEAD FRAME AND SEALING BODY

(71) Applicant: Renesas Electronics Corporation, Kawasaki-shi, Kanagawa (JP)

(72) Inventor: Kaoru Yokosawa, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/167,008

(22) Filed: Jan. 29, 2014

(65) Prior Publication Data

US 2014/0147971 A1    May 29, 2014

Related U.S. Application Data

(63) Continuation of application No. 12/848,784, filed on Aug. 2, 2010, now Pat. No. 8,649,896.

(30) Foreign Application Priority Data

Sep. 18, 2009  (JP) .................. 2009-217825

(51) Int. Cl.
*H01L 21/56* (2006.01)
*H01L 21/67* (2006.01)
(Continued)

(52) U.S. Cl.
CPC ........ *H01L 21/561* (2013.01); *H01L 21/67294* (2013.01); *H01L 23/544* (2013.01); *H01L 24/97* (2013.01); *H01L 24/45* (2013.01);
(Continued)

(58) Field of Classification Search
USPC .......................... 700/114–117, 215, 121, 225
See application file for complete search history.

(56) References Cited

U.S. PATENT DOCUMENTS 6,400,840 B2   6/2002  Wilson et al.
6,415,977 B1   7/2002  Rumsey
(Continued)

FOREIGN PATENT DOCUMENTS

JP   62-280039   12/1987
JP   03-093240    4/1991
(Continued)

OTHER PUBLICATIONS

Official Action dated Feb. 26, 2013 issued in Japanese counterpart application (No. 2009-217825) with translation.
(Continued)

*Primary Examiner* — Carlos Ortiz Rodriguez
(74) *Attorney, Agent, or Firm* — Womble Carlyle

(57) ABSTRACT

A management method is able to quickly investigate the cause of a defect generated in a semiconductor product manufacturing process. Manufacturing conditions in various QFP manufacturing steps are stored in a main server while correlating them with an identification number of the QFP, and a two-dimensional bar code corresponding to the identification number is stamped to the surface of the QFP. In the event of occurrence of a defect of the QFP, the manufacturing conditions for the QFP stored in the main server can be traced in an instant by reading the two-dimensional bar code of the QFP and thereby specifying the identification number.

15 Claims, 27 Drawing Sheets

(51) Int. Cl.
*H01L 23/544* (2006.01)
*H01L 23/00* (2006.01)

(52) U.S. Cl.
CPC ...... *H01L 24/48* (2013.01); *H01L 2223/54413* (2013.01); *H01L 2223/54433* (2013.01); *H01L 2223/54486* (2013.01); *H01L 2224/32014* (2013.01); *H01L 2224/32245* (2013.01); *H01L 2224/45015* (2013.01); *H01L 2224/45144* (2013.01); *H01L 2224/48091* (2013.01); *H01L 2224/48247* (2013.01); *H01L 2224/49171* (2013.01); *H01L 2224/73265* (2013.01); *H01L 2224/92247* (2013.01); *H01L 2224/97* (2013.01); *H01L 2924/00014* (2013.01); *H01L 2924/014* (2013.01); *H01L 2924/01005* (2013.01); *H01L 2924/01006* (2013.01); *H01L 2924/01027* (2013.01); *H01L 2924/01029* (2013.01); *H01L 2924/01033* (2013.01); *H01L 2924/01074* (2013.01); *H01L 2924/01078* (2013.01); *H01L 2924/01079* (2013.01); *H01L 2924/01082* (2013.01); *H01L 2924/10253* (2013.01); *H01L 2924/12042* (2013.01); *H01L 2924/14* (2013.01); *H01L 2924/15311* (2013.01); *H01L 2924/181* (2013.01)

(56) References Cited

U.S. PATENT DOCUMENTS

| | | | |
|---|---|---|---|
| 6,831,360 | B2 | 12/2004 | Yamaura et al. |
| 6,872,465 | B2 | 3/2005 | Soga et al. |
| 6,896,186 | B2 | 5/2005 | Kudo |
| 7,031,791 | B1 | 4/2006 | Chang |
| 7,094,633 | B2 | 8/2006 | Takiar |
| 2002/0110270 | A1 | 8/2002 | Wilson et al. |
| 2004/0259291 | A1 | 12/2004 | Takiar |
| 2006/0180864 | A1 | 8/2006 | Suzuki et al. |
| 2007/0080416 | A1 | 4/2007 | Yoshioka et al. |
| 2008/0011671 | A1 | 1/2008 | Syrkos |
| 2008/0116671 | A1 | 5/2008 | Takahashi |
| 2009/0121349 | A1 | 5/2009 | Suzuki |

FOREIGN PATENT DOCUMENTS

| | | |
|---|---|---|
| JP | H11-008327 | 1/1999 |
| JP | 2004-022981 | 1/2004 |
| JP | 2004-193189 | 7/2004 |
| JP | 2004-193189 A | 7/2004 |
| JP | 2005-191367 | 7/2005 |
| JP | 2005-294635 | 10/2005 |
| JP | 2006-066701 | 3/2006 |
| JP | 2006-066701 | 9/2006 |

OTHER PUBLICATIONS

Official Action dated Dec. 23, 2013 issued in Chinese counterpart application (No. 201010227707.8).
Official Action dated Dec. 23, 2013 issued in Chinese counterpart application (No. 201010227707.8) English Translation.
Official Action dated Jan. 28, 2014 issued in Japanese counterpart application (No. 2013-082832) with English translation.
Official Action dated Feb. 26, 2014 issued in Chinese counterpart application (No. 201010233605.7) with English translation.
Official Action dated Oct. 28, 2014 issued in Japanese counterpart application (No. 2013-082832) with English Translation.
Office Action dated Oct. 28, 2014 issued in Japanese counterpart application No. (2013-082832) with English translation.

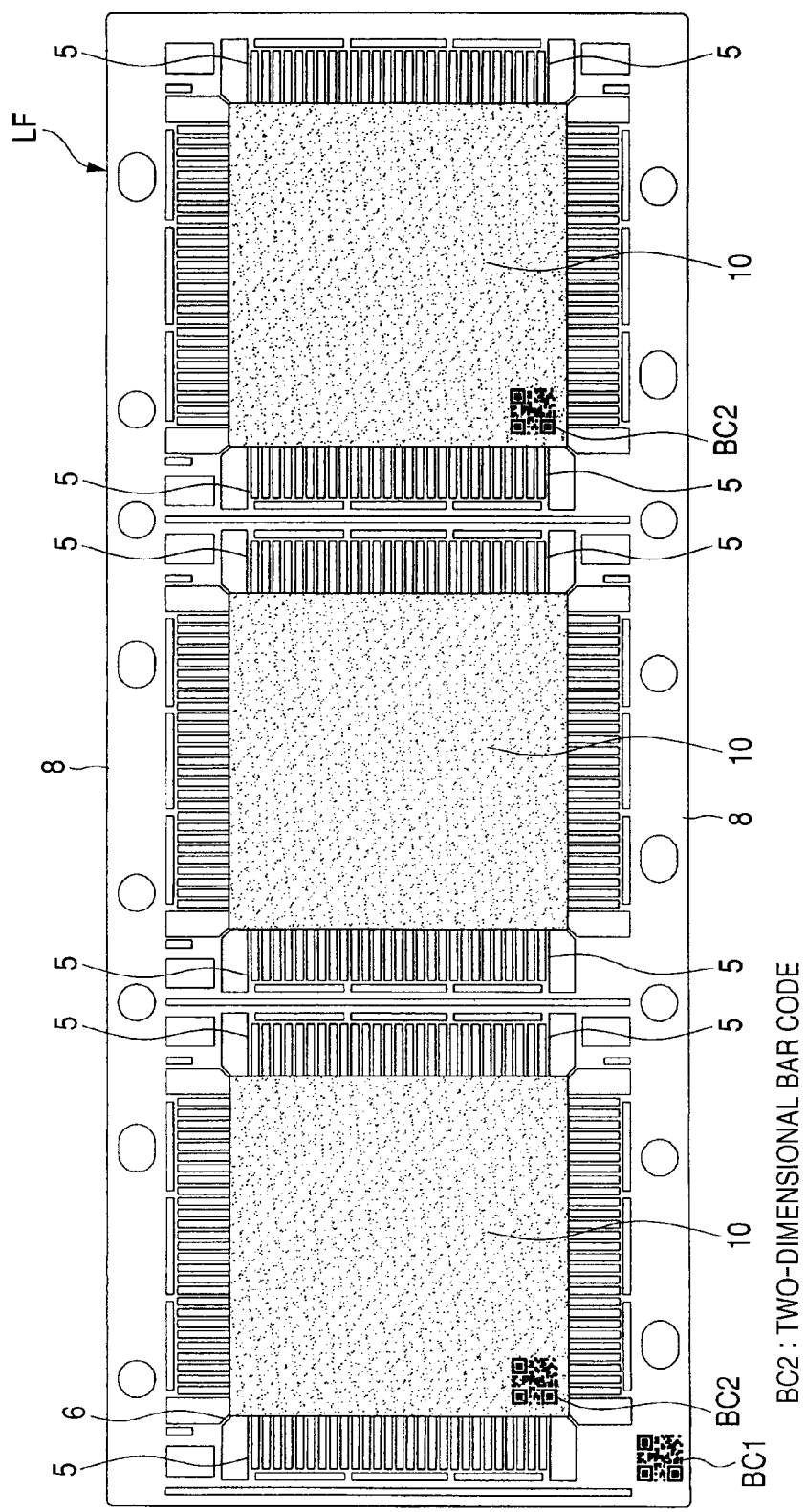

METHOD OF MANUFACTURING A SEMICONDUCTOR DEVICE USING MARKINGS ON BOTH LEAD FRAME AND SEALING BODY

CROSS-REFERENCE TO RELATED APPLICATIONS

This is a Continuation of U.S. patent application Ser. No. 12/848,784, filed Aug. 2, 2010, now U.S. Pat. No. 8,649,896, whose contents are incorporated by reference in their entirety. The disclosure of Japanese Patent Application No. 2009-217825 filed on Sep. 18, 2009 including the specification, drawings and abstract is incorporated herein by reference in its entirety.

BACKGROUND OF THE INVENTION

The present invention relates to a manufacturing method of a semiconductor device. Particularly, the present invention is concerned with a semiconductor manufacturing technique capable of quickly investigating the cause of a defect generated in a semiconductor device manufacturing process.

The semiconductor device manufacturing process broadly comprises a pre-process (wafer process) in which integrated circuits are formed on a main surface (integrated circuit-forming surface) of a semiconductor wafer, e.g., a single crystal silicon wafer, by combining photolithography technique, CVD technique, sputtering technique and etching technique and a post-process (assembling process) in which the semiconductor wafer formed with the integrated circuits is diced into a plurality of semiconductor chips and then the semiconductor chips are each sealed into a package, e.g., a resin or ceramic package.

Semiconductor device manufacturers make management of products by indicating product information such as, for example, product model name, customer logo mark and production code on the surface of each semiconductor product (semiconductor package) manufactured through the above processes.

Patent Document 1 (Japanese Unexamined Patent Publication No. Hei 11 (1999)-008327) discloses a semiconductor chip identification putting method which permits management of each of plural semiconductor chips even after separation of the semiconductor chips from a semiconductor wafer by dicing.

More particularly, first with respect to plural semiconductor chips formed on a semiconductor wafer, wafer number and intra-wafer chip positions are determined as chip identification codes. Next, when the semiconductor chips thus given chip identification codes are separated from the semiconductor wafer by dicing and mounted onto a lead frame, a bar code corresponding to the above identification code of each of the semiconductor chips is affixed to a lead frame portion located near the semiconductor chip. This bar code is read by a bar code reader, then after assembly of an IC package, a bar code corresponding to the bar code read by the bar code reader is affixed to the back surface of the IC package. According to this semiconductor chip identification code putting method, even after assembly of the IC package, the manufacturing lot number and wafer number of the semiconductor chip incorporated in the IC package can be recognized by reading the bar code affixed to the package back surface. Consequently, it becomes possible to make a follow-up survey of, for example, conditions in the manufacturing stage.

Patent Document 2 (Japanese Unexamined Patent Publication No. 2004-022981) discloses a technique for indicating externally visible product information on both a package surface and a back surface of each chip mounting portion of a lead frame in a product wherein the chip mounting portion is exposed from the package back surface, like QFN (Quad Fat No lead package) or TSSOP (Thin Shrink Small Outline Package) out of small-sized semiconductor packages. According to Patent Document 2, pieces of product information low in commonness between product types, such as, for example, customer logo mark, product model name, product code and lot trace code, are indicated on the package surface, while pieces of product information high in commonness between products such as, for example, manufacturing nation code are indicated on the back surface of the chip mounting portion. The product information on the package surface is formed by printing, sealing or laser marking after package molding, while the product information on the back surface of the chip mounting portion is formed in advance by pressing or etching before start of package assembly.

SUMMARY OF THE INVENTION

As noted above, semiconductor device manufacturers make management of products by indicating product information on the surface of a semiconductor product (semiconductor package) as a completed product.

In recent years, however, the types of semiconductor products are diversified and semiconductor product manufacturing steps are also diversified and complicated, so in the event of occurrence of a defect of a semiconductor product, it is difficult for the conventional product management methods to quickly investigate the cause of the defect.

For example, in Patent Document 1, a follow-up survey of manufacturing conditions in the pre-process is made possible by putting a semiconductor chip identification code in the form of a bar code to the back surface of the semiconductor package. This identification code cannot be utilized in the follow-up survey for investigating the cause of a defect developed in the post-process because it does not contain any information on manufacturing conditions in the post-process (assembling process).

It is an object of the present invention to provide a management method capable of quickly investigating the cause of a defect of a semiconductor product.

The above and other objects and novel features of the present invention will become apparent from the following description and the accompanying drawings.

The following is an outline of one embodiment in accordance with the present invention.

In one preferred aspect of the present invention there is provided a manufacturing method of a semiconductor device, comprising the steps of (a) providing a base member, the base member including a device area having a chip mounting portion and an outer frame portion positioned outside the device area, (b) after the step (a), putting a first identification number to the outer frame portion of the base member, (c) after the step (b), mounting a semiconductor chip over the chip mounting portion of the base member, (d) after the step (c), sealing the semiconductor chip with resin such that the outer frame portion is exposed, and forming a sealing body, and (e) after the step (d), reading the first identification number and putting first intra-server information corresponding to the read first identification number, out of a plurality of pieces of intra-server information stored in a server, as a second identification number, to the sealing body.

The following is a brief description of an effect obtained by the typical invention out of the inventions disclosed herein.

According to the preferred aspect of the present invention, conditions for manufacturing a semiconductor package stored in a computer can be traced in an instant by reading a bar code affixed to the surface of the semiconductor package, so that it is possible to take an anti-defect measure quickly.

BRIEF DESCRIPTION OF THE DRAWINGS

FIGS. 13(a) and 13(b) are diagrams showing a method for stamping a two-dimensional bar code onto a surface of molding resin, of which FIG. 13(a) is a side view of the lead frame as seen in a direction parallel to a moving direction of the lead frame and FIG. 13(b) is a side view as seen in a direction orthogonal to the lead frame moving direction;

FIG. 14 is a plan view of the lead frame, showing another example of a laser marking step;

DETAILED DESCRIPTION OF THE PREFERRED EMBODIMENTS

Figure 1:
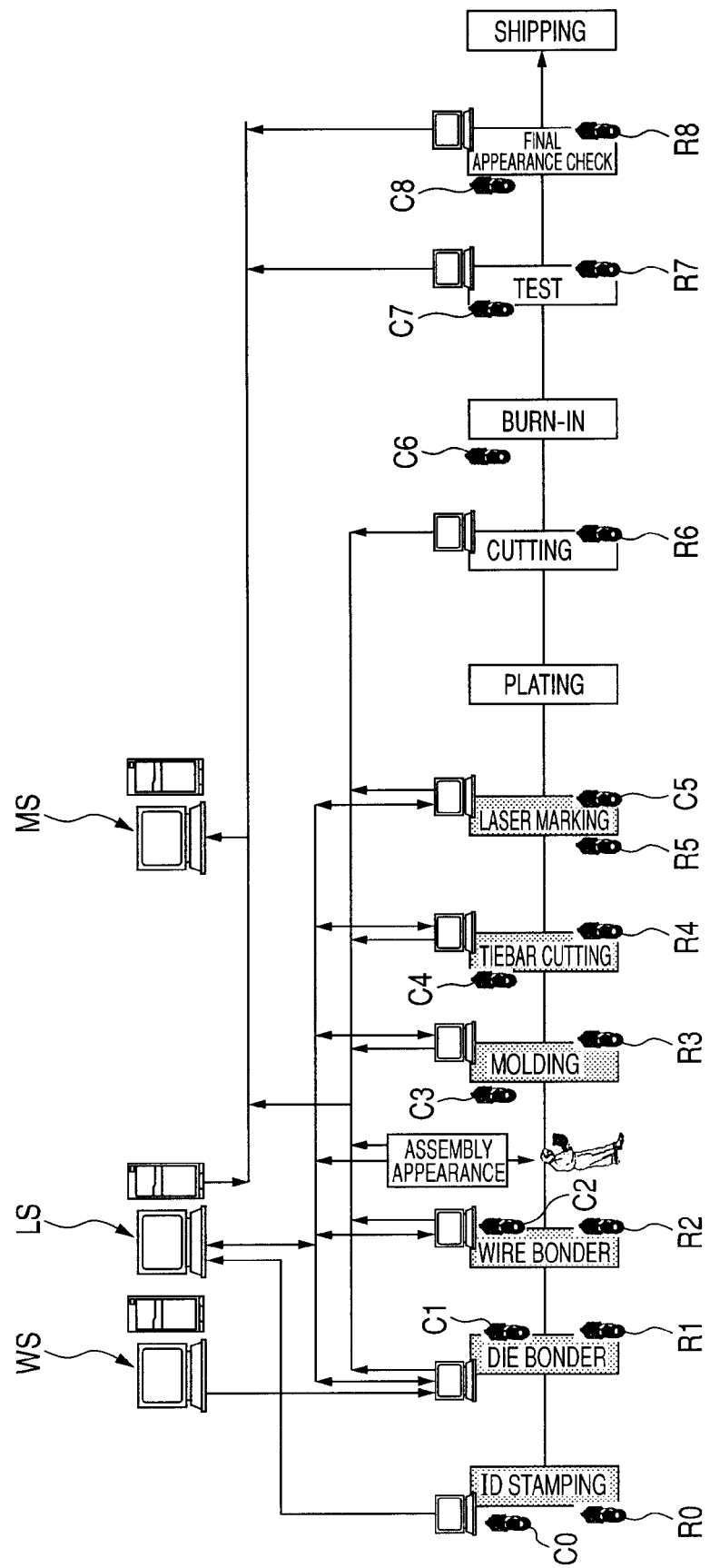
FIG. 1 is an entire flow chart showing a manufacturing process for a QFP according to a first embodiment of the present invention.

Embodiments of the present invention will be described below in detail with reference to the drawings. In all the drawings for illustrating the embodiments, members having the same functions are identified by the same reference numerals, and repeated explanations thereof will be omitted. In the following embodiments, explanations of the same or similar portions will not be repeated in principle except where such explanations are specially needed. Further, in the drawings for illustrating the following embodiments, even a plan view may be enlarged to facilitate understanding of the illustrated configuration.

First Embodiment

In this embodiment the present invention is applied to the manufacture of a QFP (Quad Flat Package) which is a kind of a semiconductor package. FIG. 1 is an entire flow chart showing a manufacturing process for the QFP.

Figure 2:
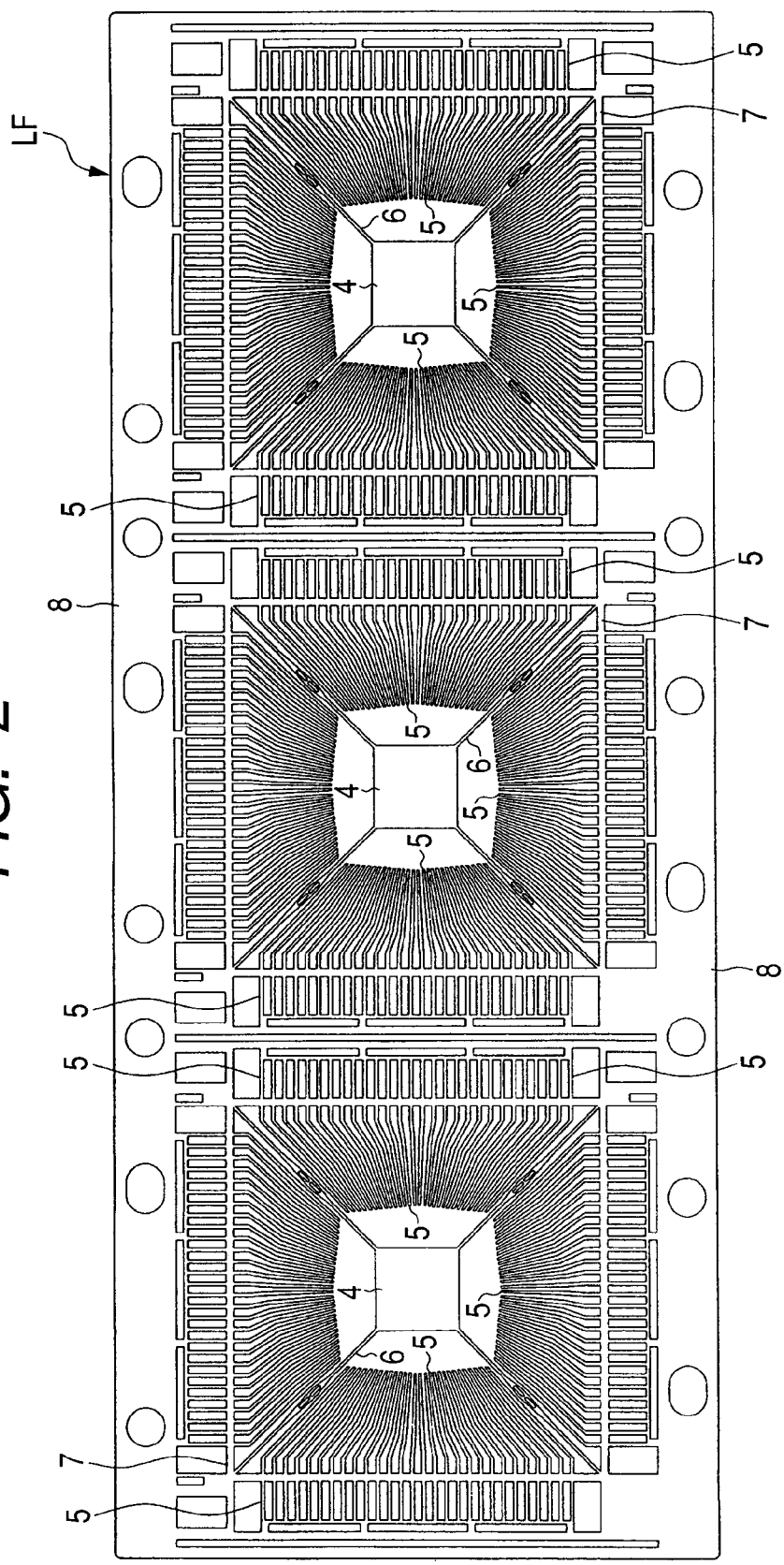
FIG. 2 is an entire plan view of a lead frame used in manufacturing the QFP.
Figure 3:
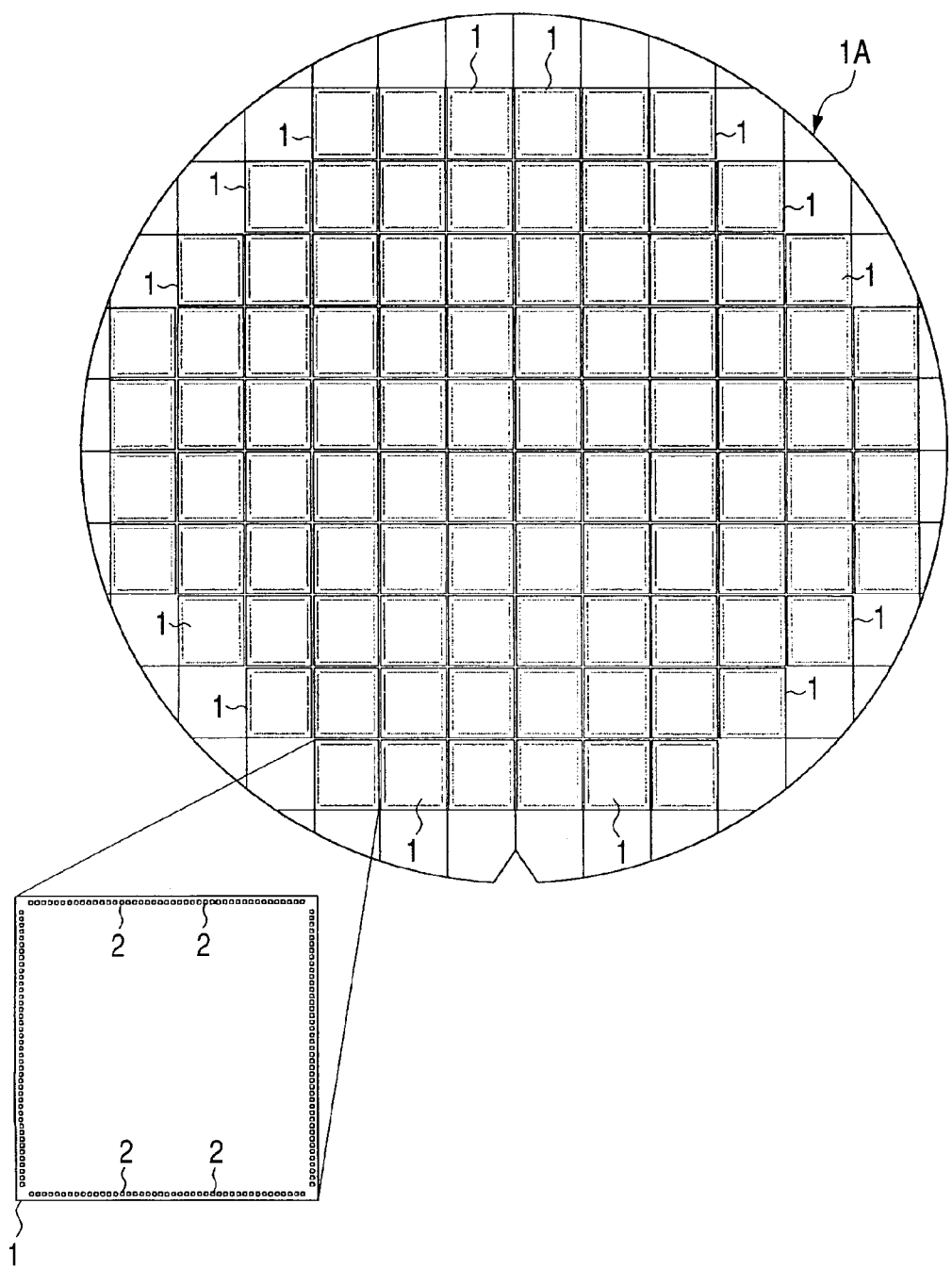
FIG. 3 is an entire plan view of a semiconductor wafer used in manufacturing the QFP.

For manufacturing the QFP, first a lead frame shown in FIG. 2 and a semiconductor wafer shown in FIG. 3 are provided as base members (chip mounting members).

<On Lead Frame>

The lead frame LF shown in FIG. 2 is formed of copper (Cu) or copper alloy and comprises a plurality of device areas (areas which will become semiconductor devices) and an outer frame portion 8 positioned outside the device areas. Each device area includes a chip mounting area (die pad, chip mounting portion) 4 as a portion for mounting a semiconductor chip, a plurality of leads 5 formed around the chip mounting area 4, a plurality of suspending leads 6 formed integrally with the chip mounting area 4, and tiebars 7 formed integrally with both leads 5 and suspending leads 6. The leads 5, suspending leads 6 and tiebars 7 are supported by the outer frame portion 8. The chip mounting area 4 is supported by the outer frame portion 8 through the suspending leads 6.

The actual lead frame is provided with a large number of die pads 4, but here the lead frame LF provided with three device areas is illustrated for making the drawings easier to see. That is, since the lead frame LF is of a structure for mounting three semiconductor chips, three QFPs can be obtained from one lead frame LF.

Although the lead frame LF used in this embodiment is formed of copper or copper alloy, it may be formed of an iron-based metal.

<On Semiconductor Wafer>

A semiconductor wafer 1A shown in FIG. 3 is in a state after completion of a pre-process and a subsequent dicing step. It is in a divided state into a large number of semiconductor chips 1. In this embodiment, as shown in FIG. 3, plural semiconductor chips 1 are formed in a matrix shape in relation to a notch formed in a peripheral edge portion of the semiconductor wafer 1A. The aforesaid pre-process includes a plurality of steps of forming an integrated circuit on each of the semiconductor chips 1 of the semiconductor wafer 1A by combining photolithography technique, CVD technique, sputtering technique and etching technique and further includes an electrical characteristic checking step of contacting a probe with a surface of each bonding pad 2 formed on the main surface of each semiconductor chip 1 and determining whether the constituent elements of the integrated circuit are good or not and whether each wiring line for coupling between elements is conductive or not.

According to this embodiment, in the pre-process there is prepared a chip identification number (ID) for each semiconductor chip, including a production lot number of the semiconductor wafer 1A, a semiconductor wafer number, the position of the semiconductor chip 1 concerned in the semiconductor wafer 1A, and information as to whether the semiconductor chip 1 is non-defective or defective, then after receipt of the semiconductor wafer 1A in the post-process, the chip identification number is stored in a server (a wafer map data management server WS). Thus, by making reference to the wafer map data management server (WS) it is possible to easily specify in which production lot each semiconductor chip 1 was manufactured and on which semiconductor wafer 1A and in which position it was located.

Next, with reference to the entire flow chart of FIG. 1 and also to FIGS. 4 to 17, the QFP manufacturing method of this embodiment will be described step by step.

<ID Stamping Step>

Figure 4:
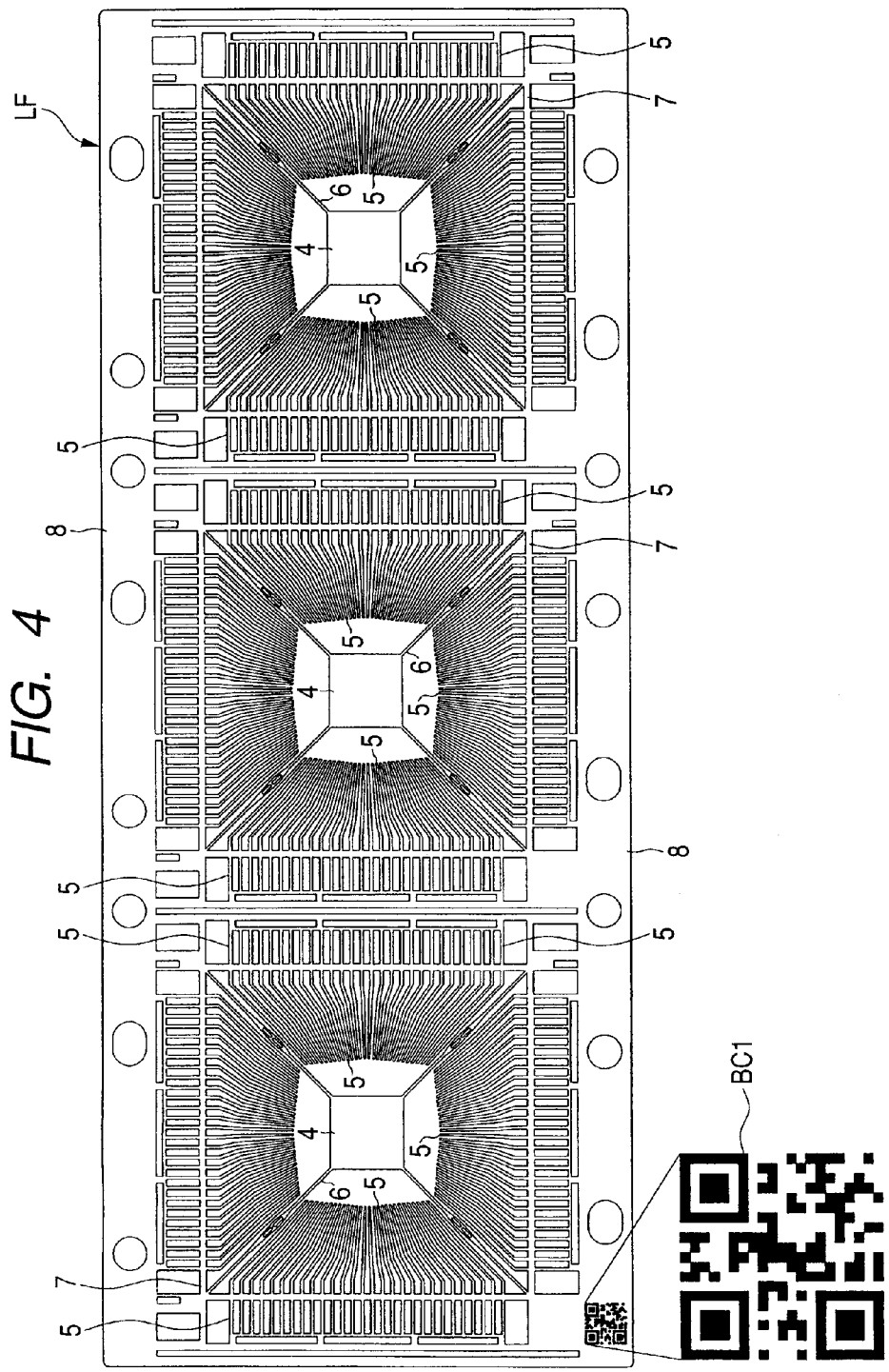
FIG. 4 is a plan view of the lead frame, showing an ID stamping step.

First, a predetermined number of lead frames LF shown in FIG. 2 are provided. Then, in each lead frame LF, as shown in FIG. 4, an identification number (ID) for identifying the lead frame LF is affixed to a surface (upper surface, main surface) of an outer frame portion 8 positioned outside the device areas of each lead frame LF. The identification number (ID) used in this embodiment is a two-dimensional code (BC1). For example, if the number of provided lead frames LF is 100, the numerals 00, 01, . . . , 99 are stamped in order in the form of a two-dimensional code (BC1) to those lead frames LF.

The two-dimensional bar code (BC1) is a bar code having information in two longitudinal and lateral directions and is characteristic in that the amount of information capable of being recorded is extremely large as compared with a one-dimensional bar code having information in only one direction. Moreover, since the two-dimensional bar code can be reduced in area as compared with a one-dimensional bar code, it can be stamped also to the surface of a lead frame LF having a narrow outer frame portion 8. In the case where the area of the outer frame portion 8 of each lead frame LF is sufficiently wide, a one-dimensional bar code may be stamped in place of the two-dimensional bar code (BC1).

By thus stamping the identification number of each lead frame LF in the form of a bar code to the surface of the lead frame LF it is possible to automate the specifying of the lead frame identification number.

A leaser beam is used for stamping the two-dimensional bar code (BC1) to the surface of the lead frame LF. A laser used in this embodiment is required to satisfy the conditions of a power of 160 W to 170 W, a pulse generating frequency (Qsw) of 27 to 35 kHz, and a polygon minor revolutions of 100 to 120 rpm. Particularly, in the case where each lead frame LF is formed of copper (Cu) or copper alloy, it is preferable to use a laser beam (so-called green laser beam) having a wavelength of 532 nm or so. Since the green laser beam is high in its absorptance for copper as compared with laser beams of other wavelengths (e.g., infrared light with a wavelength of about 1064 nm), it is easy to control the laser output. Therefore, by using the green laser beam, the two-dimensional bar code (BC1) can be stamped with high accuracy to the surface of each lead frame LF. Besides, the contamination of the lead frame surface is diminished because the amount of dust particles produced from the surface of each lead frame LF during stamping can be decreased.

Figure 5:
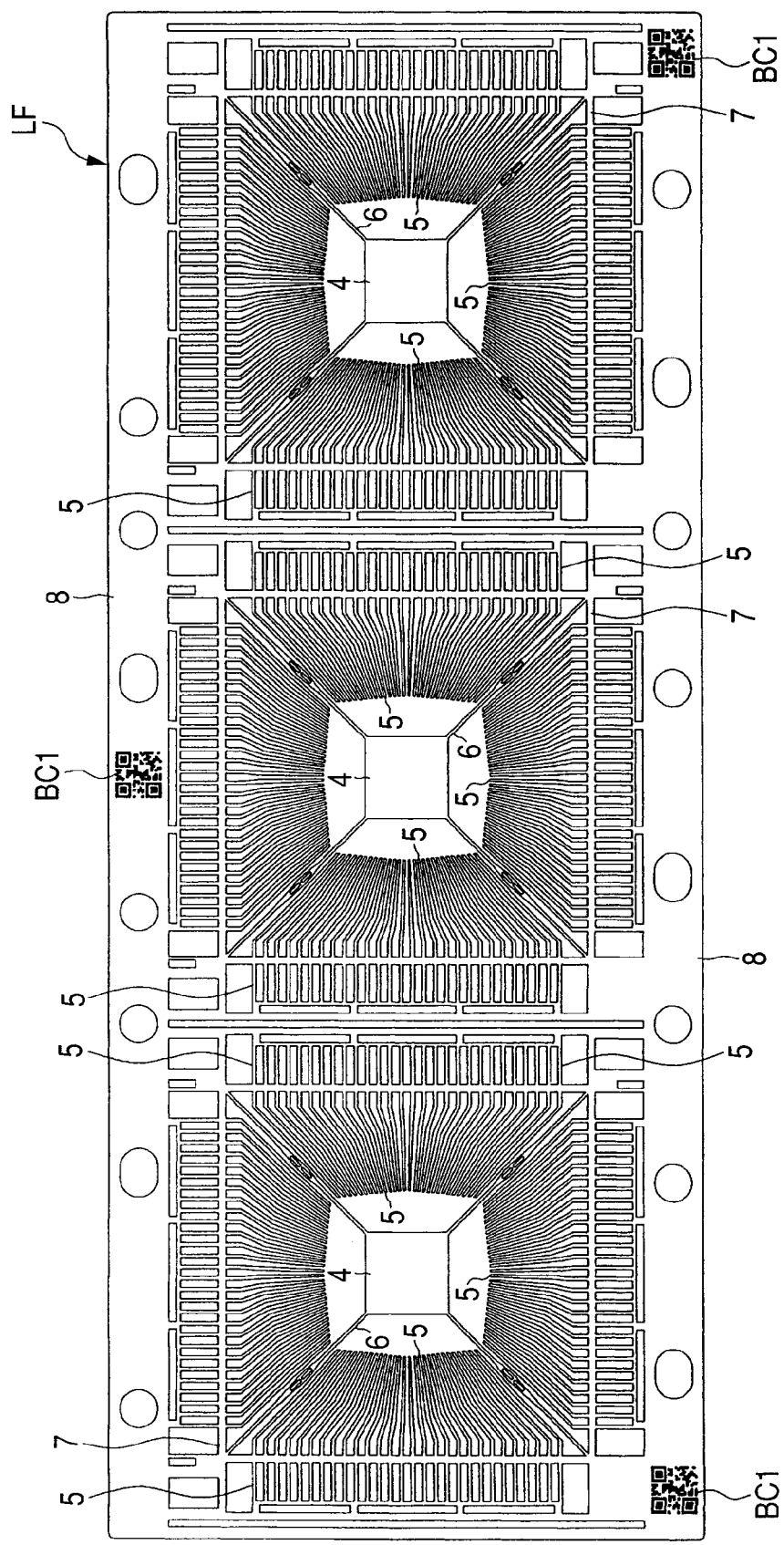
FIG. 5 is a plan view of the lead frame, showing another example of an ID stamping step.

At the time of stamping the two-dimensional bar code (BC1) to each lead frame LF, in order to prevent the two-dimensional bar code (BC1) from being damaged and becoming incapable of being read in a subsequent manufacturing step, the same two-dimensional bar codes (BC1) may be stamped to plural positions of an outer frame portion 8 as shown in FIG. 5.

Next, using a bar code reader (R0) shown in FIG. 1, the two-dimensional bar code (BC1) stamped to each lead frame LF is read and the identification number thus read is stored in a server (a lead frame map data management server LS). Now, in the lead frame map data management server (LS), preparations are completed for recording each step conditions applied to the base member corresponding to each identification number.

Further, an appearance check of each lead frame LF is performed by image recognition using a camera (C0) to check whether there is a defect (e.g., loss or deformation of leads 5). In the event a defect should be detected, there is made correlation between the identification number of the lead frame LF concerned and the defective portion, then the information thus obtained is stored in the lead frame map data management server (LS).

<Die Bonding Step>

Figure 6:
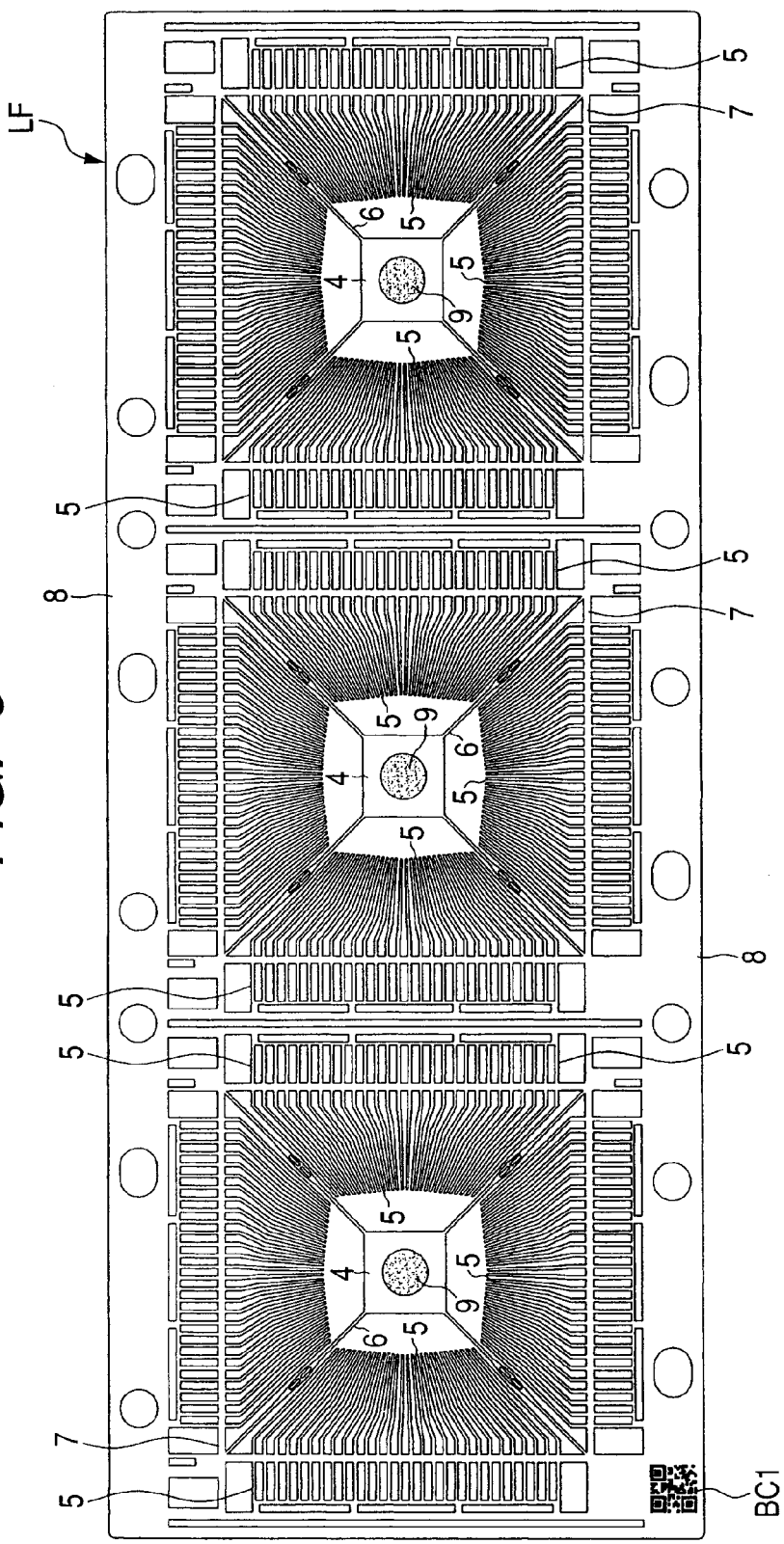
FIG. 6 is a plan view of the lead frame, showing a step of supplying an adhesive to surfaces of die pad portions.
Figure 7:
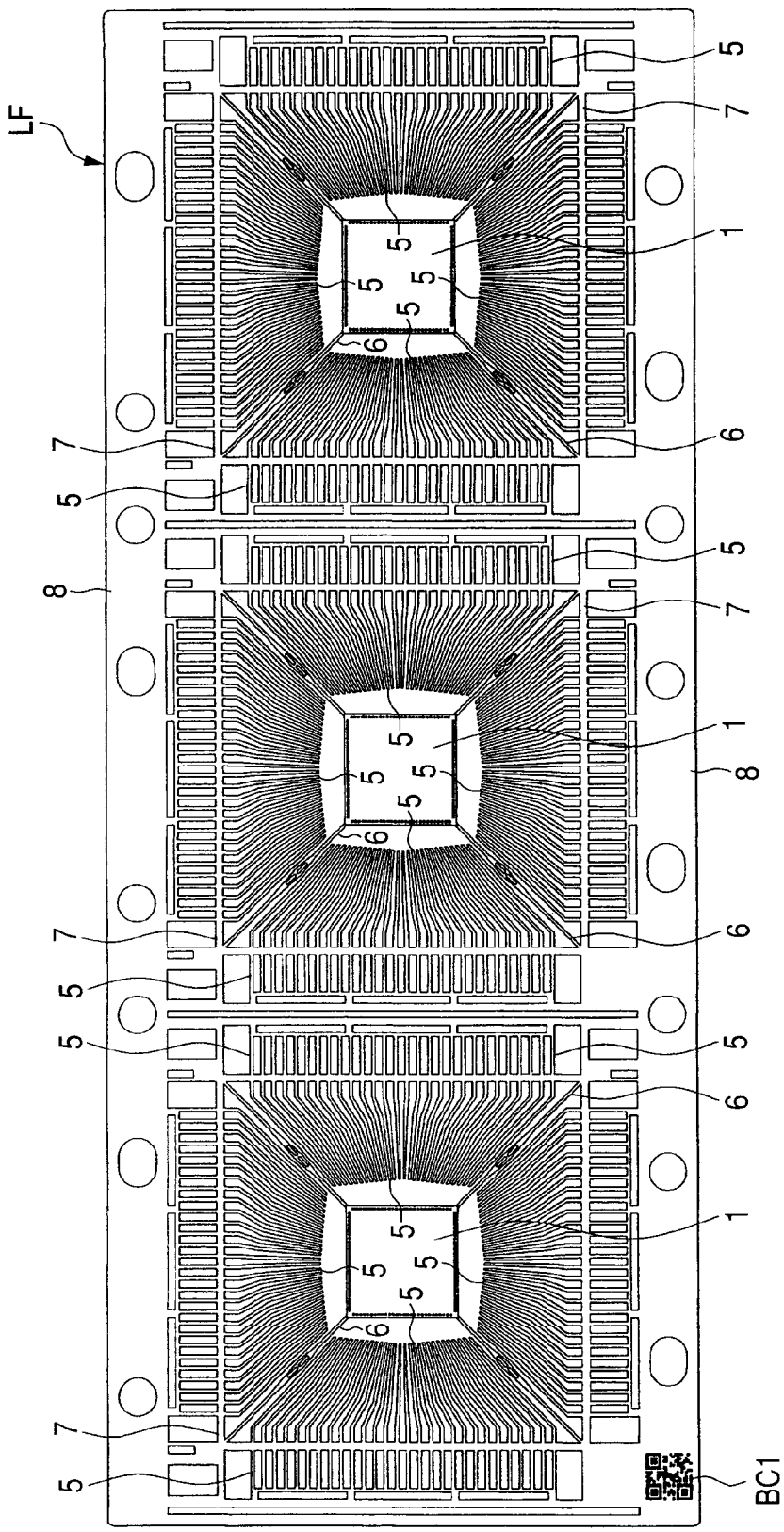
FIG. 7 is a plan view of the lead frame, showing a die bonding step.

Next, the lead frame LF with the two-dimensional bar code (BC1) stamped thereon is conveyed to a die bonder (a die bonding apparatus) which is used in a die bonding step. Then, as shown in FIG. 6, an adhesive 9 is supplied to the surface of each chip mounting area (die pad, chip mounting portion) 4 on the lead frame LF. Thereafter, as shown in FIG. 7, the semiconductor chips 1 obtained from the semiconductor wafer 1A shown in FIG. 3 are picked up one by one and mounted onto die pads 4 respectively. That is, each semiconductor chip 1 is mounted onto each chip mounting area 4 through the adhesive 9.

Figure 8:
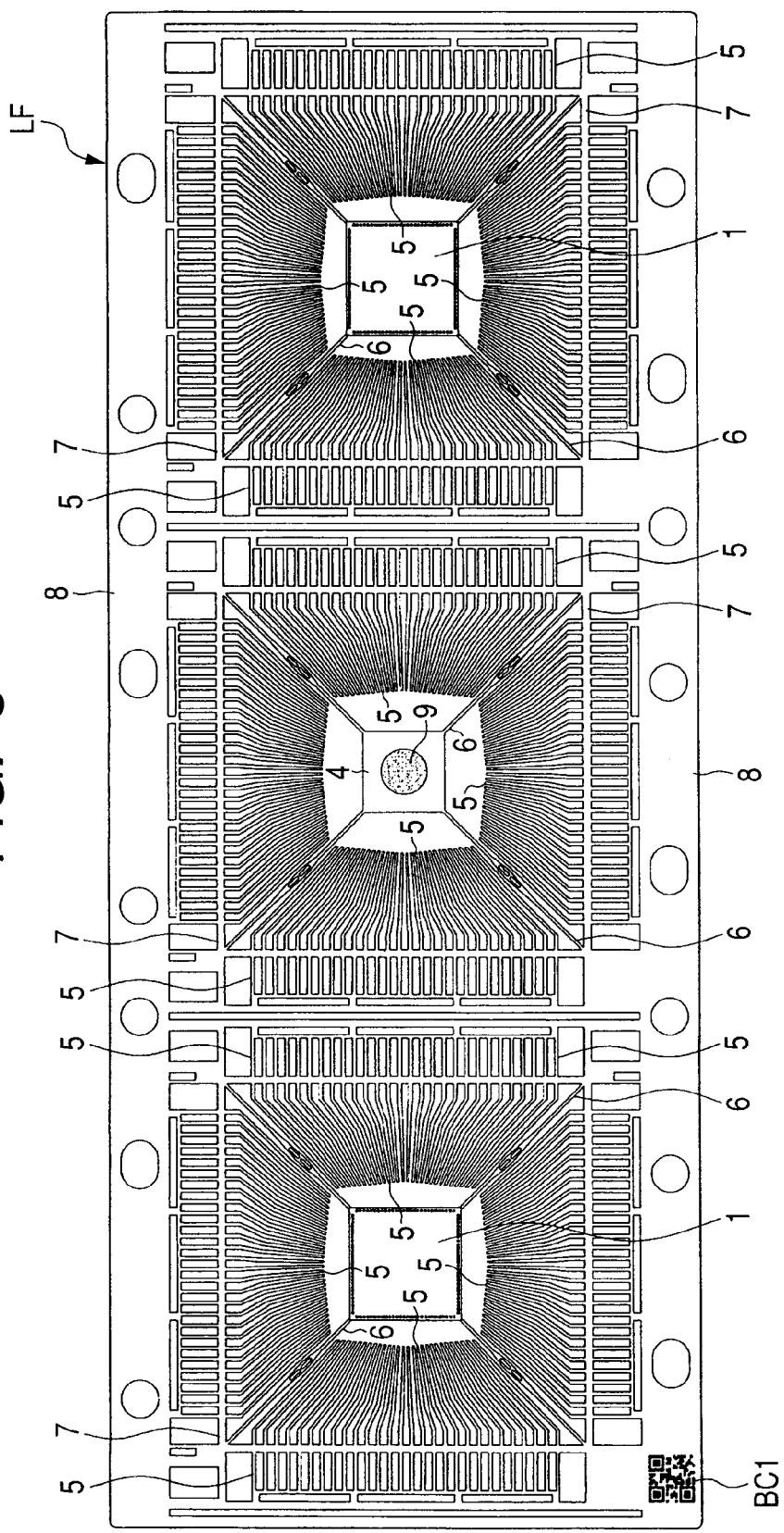
FIG. 8 is a plan view of the lead frame, showing another example of a die bonding step.

For mounting each semiconductor chip 1 onto each chip mounting area 4 of the lead frame LF, there is made alignment between the semiconductor chip 1 and the associated die pad 4 with use of a position recognizing camera (C1) shown in FIG. 1. Then, the two-dimensional bar code (BC1) stamped to the lead frame LF is read using recognition means (bar code reader R1), and information (identification number) corresponding to the lead frame LF recognized by the bar code reader (R1) in the die bonder (die bonding apparatus) out of the pieces of information (pieces of intra-server information) stored in the server (read frame map data management server LS) in a previous step (here the ID stamping step) is drawn out from the interior of the server. Next, a check is made to see if there is any defect in part of the recognized lead frame LF. If there is any defect in part of the lead frame LF with the identification number in question assigned thereto (for example, if there is a loss or deformation in the chip mounting area 4), the semiconductor chip 1 is not mounted onto the chip mounting area 4 located at the portion (the central portion in this example) including the defect, as shown in FIG. 8.

For mounting each semiconductor chip 1 onto each of the chip mounting areas 1 of the lead frame LF, reference is made to the identification information of the semiconductor chip 1 concerned which is stored in the wafer map data management server (WS) and a check is made to see if the semiconductor chip 1 corresponding to that identification information is a non-defective product or a defective product. If the semiconductor chip 1 concerned is a defective product, it is not mounted onto the chip mounting area 4.

Next, there is made correlation between the identification number of the lead frame LF obtained from the two-dimensional bar code (BC1) and the identification number of the semiconductor chip 1 mounted on the lead frame LF and the information thus obtained (updated intra-server information)

is stored in a server (main server MS). Further, there is made correlation between the conditions (manufacturing conditions: e.g., model number of the die bonding apparatus used and the type of the adhesive 9) used when the semiconductor chip 1 was mounted onto the die pad 4 of the lead frame LF and the identification number of the lead frame LF, and the information thus obtained is stored in the main server (MS).

In this way the semiconductor chip 1 is mounted onto each die pad 4 on each lead frame LF, correlation is made between the identification number of each lead frame LF and that of each semiconductor chip mounted on the lead frame LF, and the information thus obtained is stored in the main server (MS). Further, there is made correlation between the conditions used when the semiconductor chip 1 was mounted onto each die pad 4 on each lead frame LF and the identification number of each lead frame LF, and the information thus obtained is stored in the main server (MS).

Thereafter, each lead frame LF is put into a single wafer baking oven and the adhesive 9 is heat-cured to fix the semiconductor chips 4 onto the die pads 4 respectively.

<Wire Bonding Step>

Figure 9:
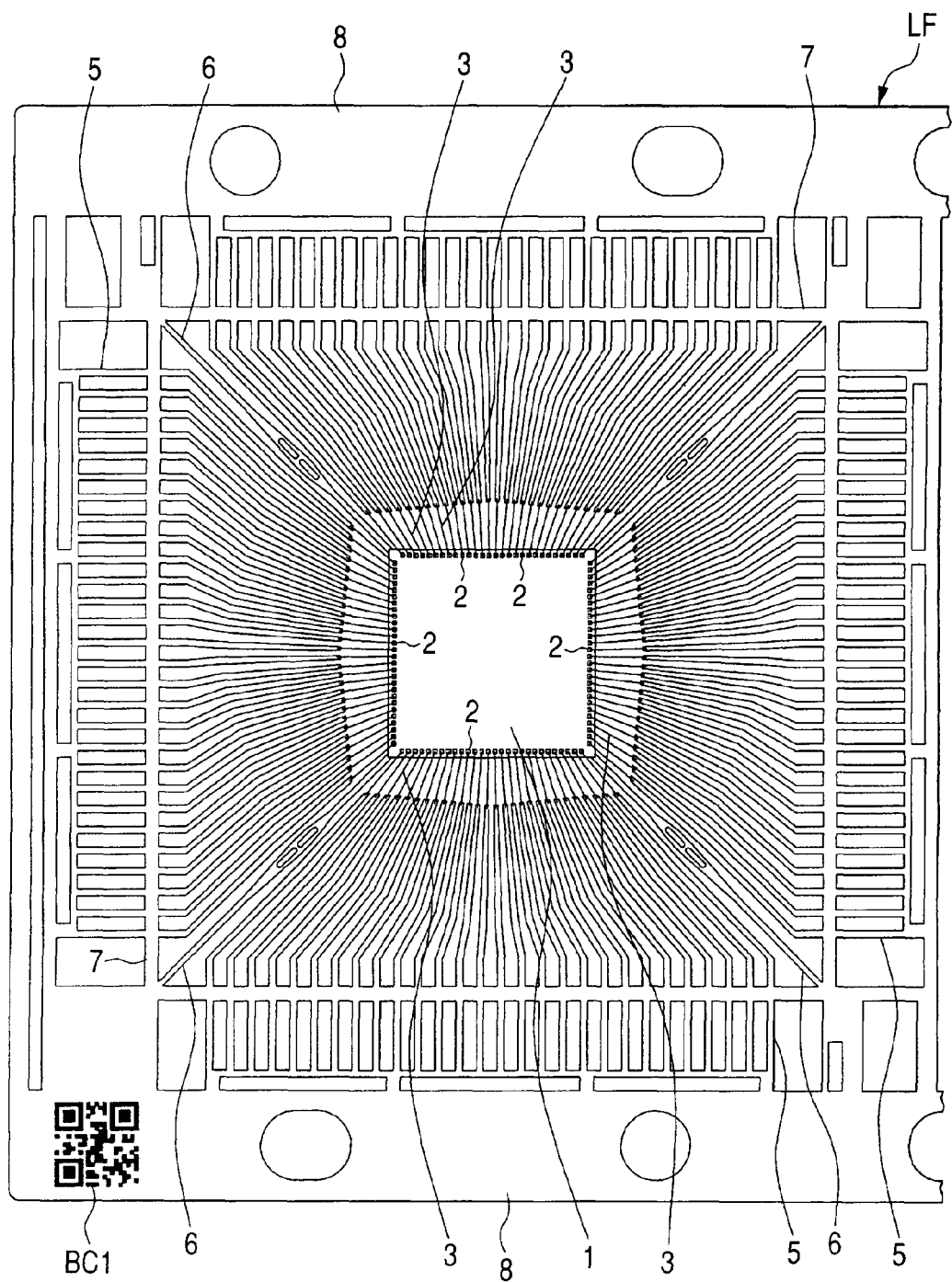
FIG. 9 is a partially enlarged plan view of the lead frame, showing a wire bonding step.

Next, each lead frame LF having gone through the die bonding step is conveyed to a wire bonder (wire bonding apparatus) used in a wire bonding step. Then, using a position recognizing camera (C2) shown in FIG. 1, the lead frame LF is positioned onto a stage of the wire bonding apparatus and thereafter, as shown in FIG. 9 (a partially enlarged plan view of the lead frame LF), bonding pads 2 of each semiconductor chip 1 and leads 5 are coupled together electrically through conductive members 3. The conductive members used in this embodiment are gold (Au) wires.

Then, the two-dimensional bar code (BC1) stamped to the lead frame LF is read using recognition means (bar code reader R2), and information (identification number) corresponding to the lead frame LF which has been recognized by the bar code reader (R2) in the wire bonder (wire bonding apparatus), out of the plural pieces of base member information (pieces of intra-server information) which were stored in the server (lead frame map data management server LS) in a previous step, is drawn out from the interior of the server. Then, a check is made to see if there is a defect in part of the recognized lead frame LF. As a result, if a defect is found in part of the lead frame LF with the said identification number assigned thereto, wires 3 are not bonded to the portion including the defect.

Next, there is made correlation between bonding conditions for the wires 3 (manufacturing conditions: e.g., model number of the wire bonding apparatus used and the diameter of each wire 3) and the identification number of the lead frame LF obtained from the two-dimensional bar code (BC1), and the information (updated intra-server information) thus obtained is stored in the server (main server MS).

In this way bonding pads of each semiconductor chip mounted on each lead frame LF and the leads 5 are coupled together electrically, then correlation is made between the bonding conditions for the wires 3 and the identification number of each lead frame LF, and the information thus obtained is stored in the server (main server MS).

Thereafter, an appearance check for each lead frame LF is performed to check the wires 3 for breaking or short-circuit. In the event a defect should be detected, the identification number of the associated lead frame LF obtained from the two-dimensional bar code (BC1) and the detective portion are correlated with each other and the information thus obtained is stored in the lead frame map data management server (LS).

<Molding Step>

Figure 10:
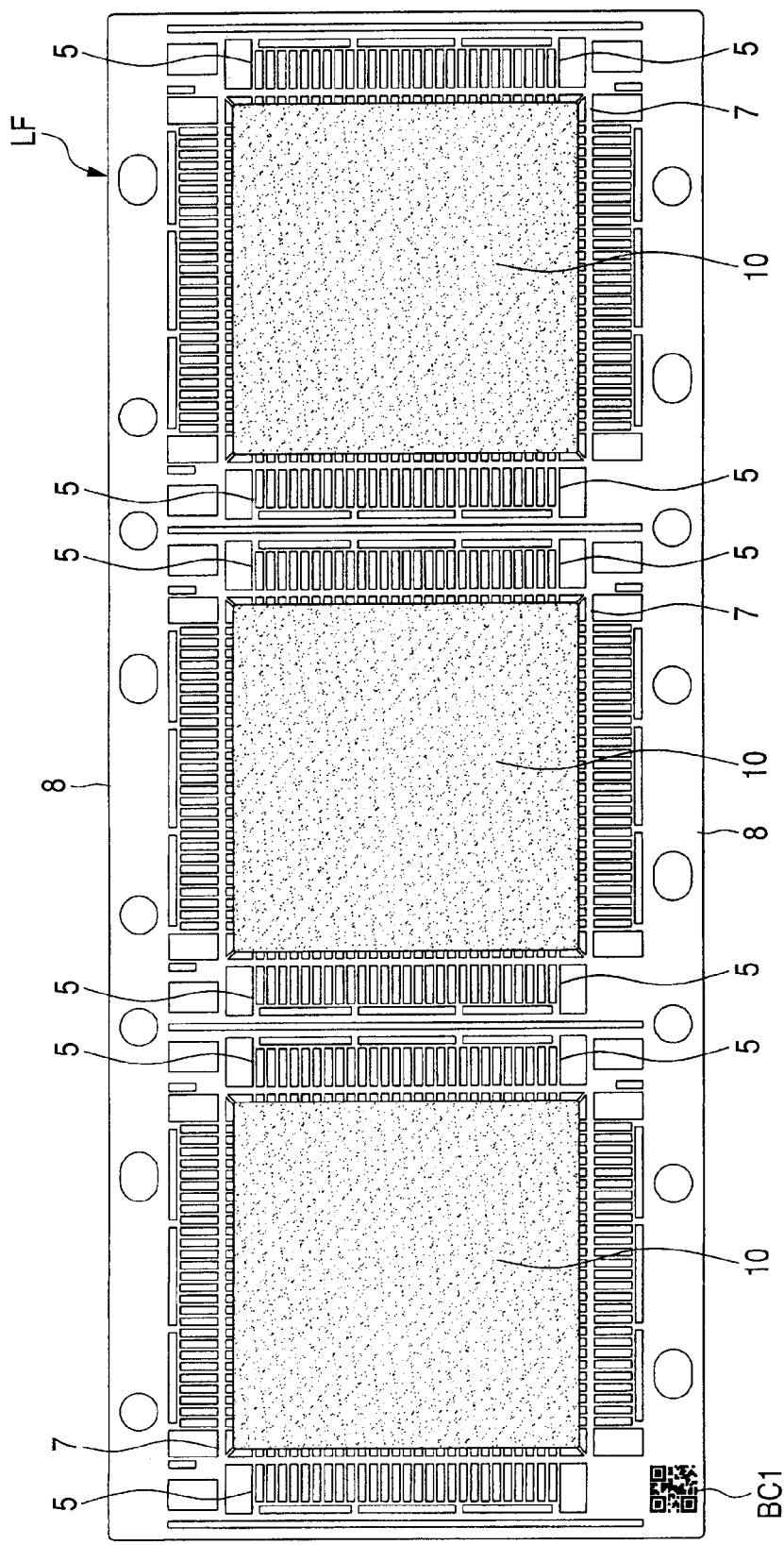
FIG. 10 is a plan view of the lead frame, showing a molding step.

The lead frame LF having gone through the wire bonding step (or the appearance checking step) is then conveyed into a molding apparatus (mold) used in a molding step (resin sealing step). Then, the lead frame LF is disposed within a mold (not shown) of the molding apparatus and the two-dimensional bar code (BC1) stamped to the lead frame LF is read using recognition means (bar code reader R3) in the molding apparatus if necessary. Further, the information (identification number) corresponding to the lead frame LF recognized by the bar code reader R3 in the molding apparatus, out of the pieces of base member information (pieces of intra-server information) which were stored in the server (lead frame map data management server LS) in a previous step, is drawn out from the interior of the server. Then, as shown in FIG. 10, the semiconductor chip 1, wires 3, chip mounting area (die pad) 4, portions (inner leads) of the leads 5 and portions of the suspending leads 6 are sealed with resin (molding resin) to form a sealing body (resin sealing body) 10. In this case, the device area (the semiconductor chip 1 mounted in the device area) is sealed with resin such that the identification number (ID, two-dimensional bar code BC1) formed on the outer frame portion 8 is exposed to the exterior of the sealing body 10. Further, the resin filling performance is monitored using a camera (C3) shown in FIG. 1.

Next, the two-dimensional bar code (BC1) stamped to the lead frame LF is read using the bar code reader (R3), thereafter, correlation is made between molding conditions (manufacturing conditions: e.g., model number of the molding apparatus used and the kind of the sealing body 10) and the identification number of the lead frame LF obtained from the two-dimensional bar code (BC1), and the information thus obtained (updated intra-server information) is stored in the server (main server MS).

In this way each lead frame LF is loaded to the mold of the molding apparatus and each semiconductor chip 1, wires 3, chip mounting area (die pad) 4, portions (inner leads) of the leads 5 and portions of the suspending leads 6 are sealed with resin. Further, there is made correlation between the molding conditions and the identification number of each lead frame LF, and the information thus obtained is stored in the main server (MS).

<Tiebar Cutting Step>

Figure 11:
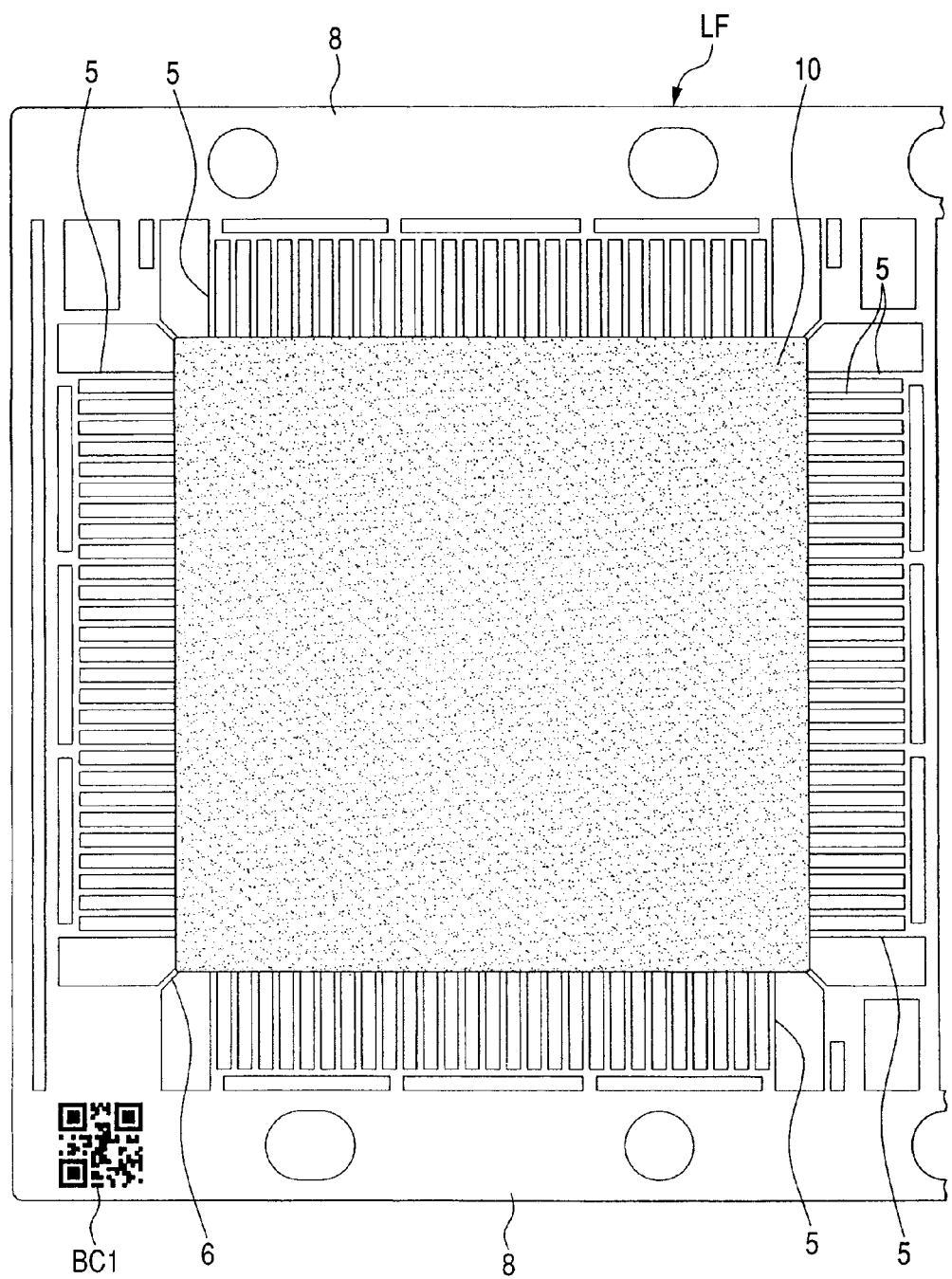
FIG. 11 is a partially enlarged plan view of the lead frame, showing a tiebar cutting step.
Figure 12:
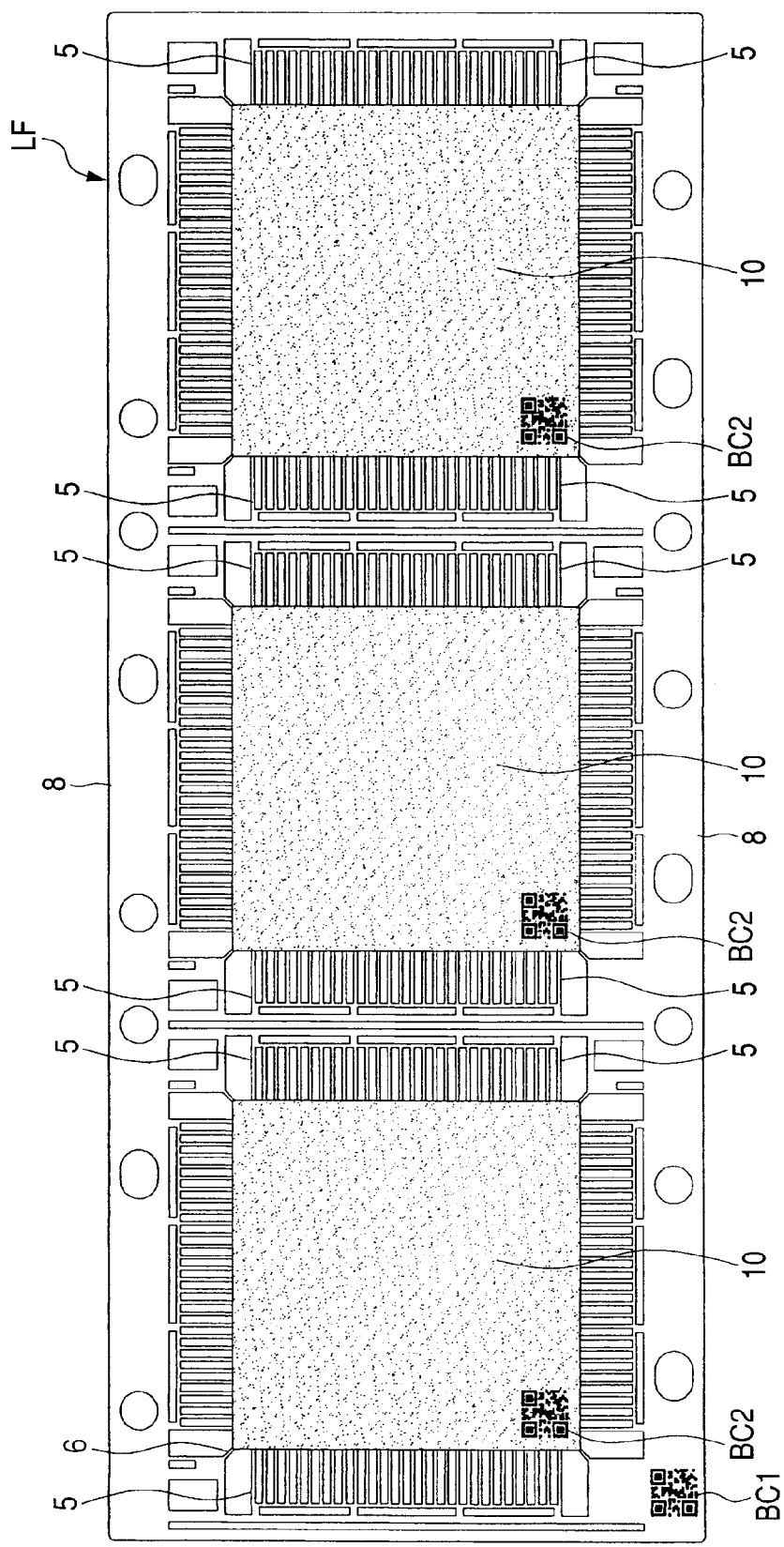
FIG. 12 is a plan view of the lead frame, showing a laser marking step.

Next, as shown in FIG. 11, tiebars 7 of the lead frame LF, which bars are exposed to the exterior of the sealing body 10, are cut to separate the leads (outer leads) 5 electrically from one another. The tiebars 7 are for preventing resin leakage to the exterior from the area where the sealing body 10 is formed in the previous resin sealing step. In this tiebar cutting step, the state of cutting is monitored using a camera (C4) shown in FIG. 1.

Then, the two-dimensional bar code (BC1) stamped to the lead frame LF is read using recognition means (bar code reader R4), thereafter, correlation is made between cutting conditions (manufacturing conditions: e.g., model number of the cutter used) for the tiebars and the identification number of the lead frame obtained from the two-dimensional bar code (BC1), and the information (updated intra-server information) thus obtained is stored in the server (main server MS).

In this way the tiebars 7 of each lead frame LF are cut and there is made correlation between the cutting conditions for the tiebars and the identification number of the lead frame LF, then the information thus obtained is stored in the main server (MS).

Subsequently, each lead frame LF is put into a single wafer baking oven and the constituent resin of the sealing body 10 is cured completely.

<Laser Marking Step>

Next, the lead frame LF having gone through the molding step (or the baking process) is conveyed to an apparatus used in a laser marking step and a two-dimensional bar code (BC2) is stamped to the surface of each sealing body 10 formed on the lead frame LF.

In this two-dimensional bar code (BC2) forming step, first the two-dimensional bar code (BC1) stamped at a portion (outer frame portion 8) outside the device area of the base member (lead frame LF) is read using recognition means (bar code reader R5) in the laser marking apparatus. Then, information (e.g., intra-server information, chip position information, wafer production lot number, semiconductor wafer number, assembly lot number, product model name) corresponding to the lead frame LF recognized by the bar code reader (R5) in the laser marking apparatus, out of the pieces of base member information (pieces of intra-server information) which were stored in the server (lead frame map data management server LS) in a previous step, is drawn out from the interior of the server. Next, this drawn-out information is formed as a new identification number (two-dimensional bar code BC2) on the surface side of the sealing body 10.

As to the information to be stored in the two-dimensional bar code (BC2) formed on the surface of the sealing body, it is possible to selectively call information managed by the server and let it be stored in the two-dimensional code (BC2), with no limitation being made to the said information. Therefore, the information stored in the two-dimensional bar code (BC2) may be the same information as the two-dimensional bar code (BC1) stamped to the outer frame portion 8 of the lead frame LF. In this case, by collating information of the corresponding base member (lead frame LF) from among the pieces of base member information which have been stored in the lead frame map data management server (LS), after identification by the bar code reader, it is possible to draw out the aforesaid various pieces of information. In this embodiment, conditions of the laser used in the laser marking step are the same as those used in the ID stamping step, but no limitation is made thereto.

Figure 13A:
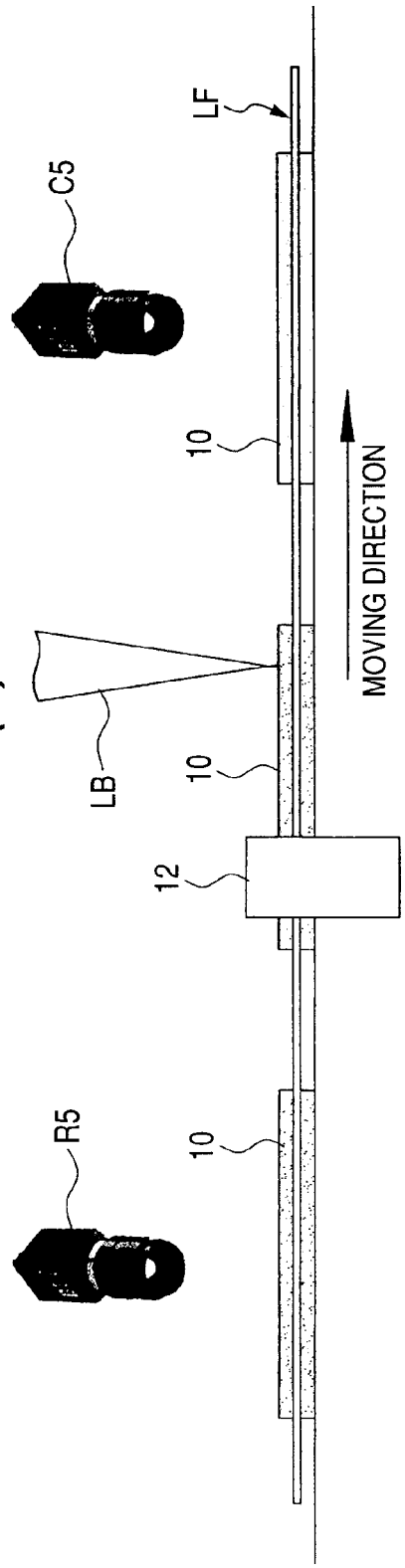
Figure 13B:
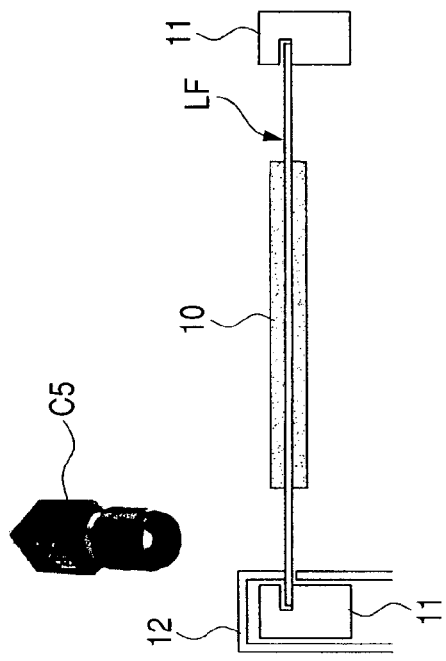

FIGS. 13(a) and 13(b) are diagrams showing a method for stamping the two-dimensional bar code (BC2), of which FIG. 13(a) is a side view as seen in a direction parallel to the moving direction of the lead frame LF and FIG. 13(b) is a side view as seen in a direction orthogonal to the moving direction of the lead frame LF. In these figures, the numeral 11 denotes a guide rail of the laser marking apparatus and numeral 12 denotes a conveyance pawl.

For stamping the two-dimensional bar code (BC2) to the surface of the sealing body 10 formed on the lead frame LF, first the two-dimensional bar code (BC1) stamped to the outer frame portion 8 of the lead frame LF is read with use of the bar code reader (R5) to specify the identification number of the lead frame LF. As shown in FIG. 13, when holding and conveying the lead frame LF with the guide rails 11, only the lower surface of the lead frame LF is held, so by disposing the bar code reader (R5) above the lead frame LF it is possible to read the two-dimensional bar code (BC1) easily. When reading the two-dimensional bar code (BC1) by the bar code reader (R5), it is preferable to stop the guide rails 11 or allow the lead frame LF to move at a low speed.

Next, laser beam LB is radiated to the surfaces of the sealing bodies 10 in a successive manner to stamp to each of the surfaces a two-dimensional bar code (BC2) corresponding to the identification number of the lead frame LF concerned. In this embodiment, though not shown, marks of product information (e.g., product model name, customer logo mark, production code) are also stamped to the surface of each sealing body at the time of stamping the two-dimensional code (BC2) thereto. By so doing, the marking step can be done as a single step and hence it is possible to simplify the manufacturing process.

When stamping the two-dimensional bar code (BC2) and marks, reference is made to the lead frame map data management server (LS) to check whether a defect has occurred in part of the lead frame LF concerned in the steps so far gone through. If a defect has occurred in part of the lead frame LF, the two-dimensional bar code (BC2) and marks are not stamped to the surface of the sealing body 10 which includes the defect (the central sealing body in the illustrated example), as shown in FIG. 14. Although in this embodiment a reference has been made above to an example of forming the two-dimensional bar code (BC2) on the surface side of each sealing body 10, the bar code in question may be formed on the back surface side of the sealing body 10.

Next, using a camera (C5), a check is made to see if the two-dimensional code (BC2) and marks have surely been stamped or not, and the result is stored in the main server (MS) while correlating it with the identification number of the lead frame LF concerned.

<Exterior Plating Step>

Next, the lead frame LF after completion of the above stamping of the two-dimensional bar code (BC2) and marks is immersed in an electrolytic plating tank to form a plating layer (plating film) comprising so-called lead-free solder (the lead (Pb) content is prescribed to be 1000 ppm (0.1 wt %) or less in RoHS Instructions) on the surface of the lead frame LF exposed to the exterior of the sealing body 10. The material of the lead-free solder in this embodiment is tin (Sn) or an alloy containing tin (Sn) as a principal component, more specifically, tin (Sn)-bismuth (Bi) alloy.

Figure 15:
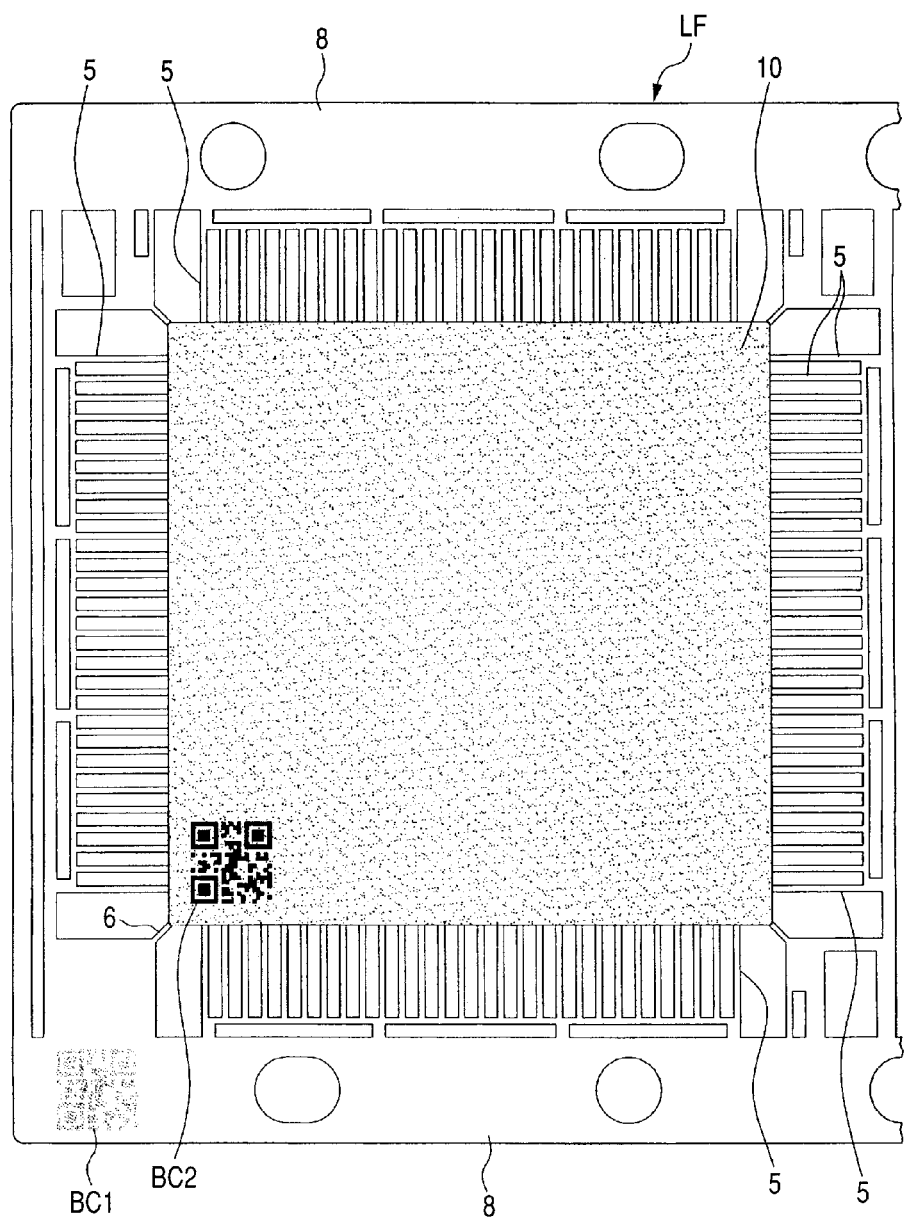
FIG. 15 is a partially enlarged plan view of the lead frame after an exterior plating step.

As a result of the exterior plating there is formed a plating layer also on the surface of the two-dimensional bar code (BC1) stamped to the outer portion 8 of the lead frame LF, resulting in deposition of the plating layer within grooves of the two-dimensional bar code (BC1) stamped to the outer frame portion 8 of the lead frame LF, as shown in FIG. 15. Consequently, it becomes difficult for the bar code reader to recognize the two-dimensional bar code (BC1) which has been formed on the outer frame portion 8.

In this embodiment, however, prior to the exterior plating step, the two-dimensional code (BC2) is stamped to the surface of each sealing body 10 on the basis of the two-dimensional bar code (BC1) stamped to the outer frame portion 8 and the information stored in the lead frame map data management server (LS), so that it is possible to avoid the above-mentioned inconvenience.

Moreover, in case of forming the two-dimensional bar code (BC2) for example by an ink marking method, there is a fear that the formed information (two-dimensional bar code) may be deformed (melted) by the plating solution used in the exterior plating step. In this embodiment, however, since the two-dimensional bar code (BC2) is formed by stamping, there is no fear of the two-dimensional bar code (BC2) being deformed by the plating solution even if the exterior plating is performed after formation of the two-dimensional code (BC2).

<Lead Frame Cutting Step>

Figure 16:
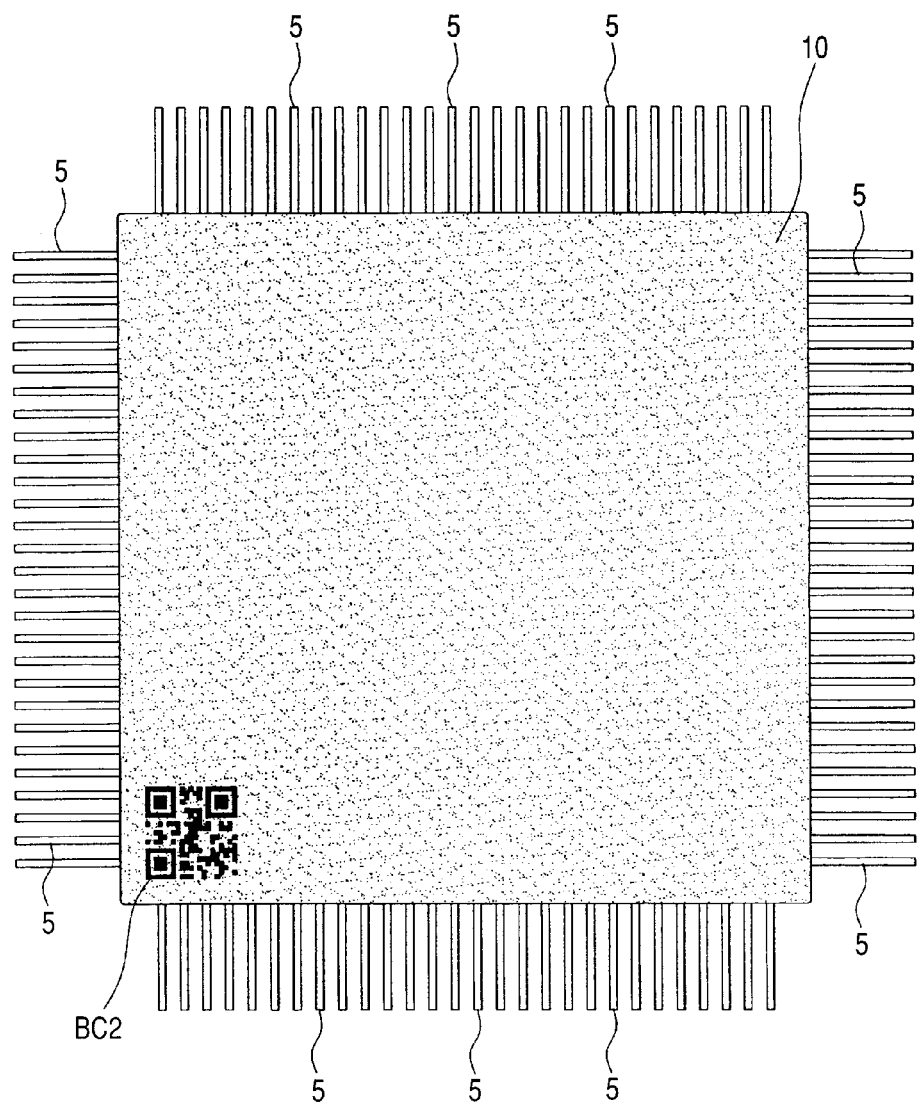
FIG. 16 is a plan view showing a sealing body after a lead frame cutting step.
Figure 17:
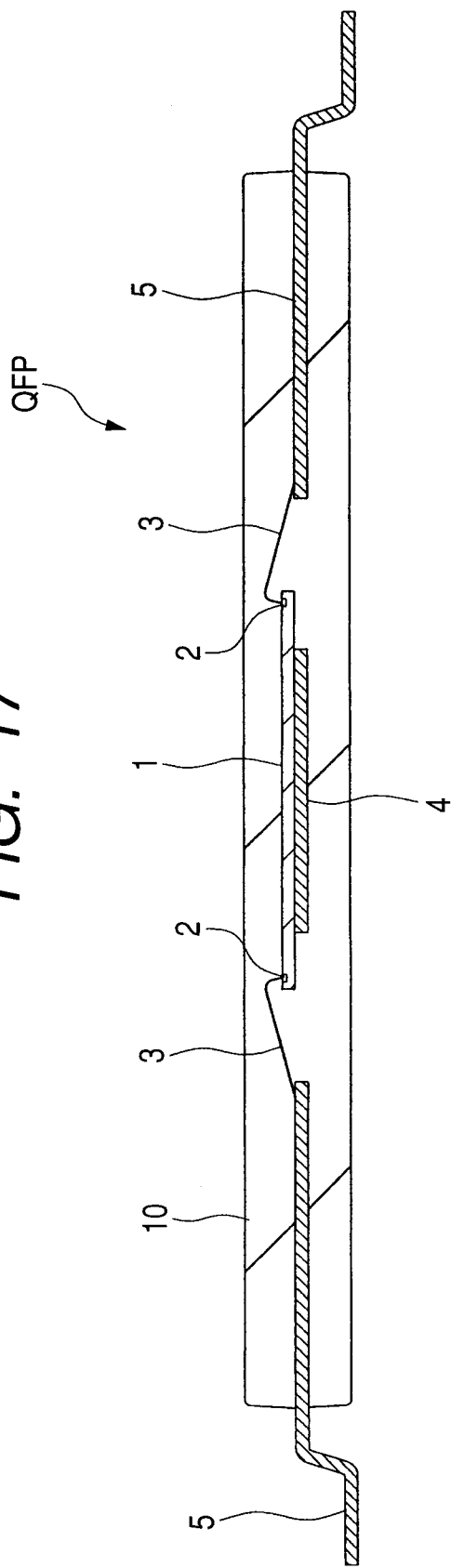
FIG. 17 is a sectional view showing a completed state of the QFP.

Next, the lead frame LF after completion of the above exterior plating is conveyed to a lead frame cutting step. In this step, as shown in FIG. 16, unnecessary portions (tiebars 7 and outer frame portion 8) of the lead frame LF, which portions are exposed to the exterior of each sealing body 10, are cut off. Subsequently, as shown in FIG. 17, the leads (outer leads) exposed to the exterior of the sealing body 10 are formed into a gull wing shape, whereby a QFP is completed.

Next, the two-dimensional bar code (BC2) of each QFP is read using a bar code reader (R6) shown in FIG. 1. The QFP not stamped with the two-dimensional bar code (BC2) on the surface of the sealing body 10 is removed as a defective product and only the QFPs determined to be non-defective products are picked up and stored onto a tray.

<Testing Step>

Next, the QFPs stored as non-defective products on the tray are each conveyed to a testing step, in which a burn-in test and an electrical characteristic test are conducted. In the burn-in test step, the QFP is loaded to a burn-in socket with use of a camera (C6) shown in FIG. 1, while in the electrical characteristic test, the QFP is loaded to a test socket with use of a camera (C7).

Then, the two-dimensional bar code (BC2) of the QFP is read by a bar code reader (R7). Further, correlation is made between test results and the identification number of the QFP and the information thus obtained is stored in the main server (MS).

<Final Appearance Checking Step>

Next, each QFP determined to be a non-defective product in the above testing step is conveyed to a final appearance checking step. In this step, appearance check is made by image recognition using a camera (C8) shown in FIG. 1 to check whether there is a loss or deformation of leads 5 (outer leads).

Then, the two-dimensional bar code (BC2) of each QFP is read using a bar code reader (R8). Further, the test results and the identification number of the QFP are correlated with each other and the information thus obtained is stored in the main server (MS).

The QFPs thus manufactured through the steps described above are shipped from the manufacturer to a customer, in which they are each mounted on a predetermined wiring substrate and then used. The shipping from the manufacturer to the customer is managed in correlation with the above two-dimensional bar code (BC2).

In this embodiment the identification number (ID, two-dimensional bar code) is stamped to the outer frame portion 8 of the base member (lead frame LF) and is read in the molding step, then out of the pieces of information (pieces of intra-server information) stored in the lead frame map data management server (LS), the information (intra-server information) corresponding to the base member identification number (first identification number) thus read is encrypted as a new identification number (ID, two-dimensional bar code) and the thus-encrypted identification number (second identification number) is put (formed) onto the sealing body 10.

In the case where a defect occurred in a completed semiconductor device (QFP) on the customer side after shipping of the QFP, the manufacturer reads with the bar code reader the two-dimensional bar code (BC2) stamped to the sealing body 10 of the defective QFP, thereby specifying the identification number of the QFP.

In the manufacturer's main server (MS), such pre-process information as from which production lot of semiconductor wafer the semiconductor chip sealed in each QFP was fabricated and at which position of the semiconductor wafer it was located, is stored in correlation with the identification number of the QFP concerned. Post-process information such as under what conditions and by what manufacturing equipment each QFP was manufactured, as well as corresponding operator information and the materials used, in the above die bonding step, wire bonding step, molding step, tiebar cutting step, laser marking step, exterior plating step, and lead frame cutting step, is also stored in the manufacturer's main server in correlation with the identification number of the QFP concerned.

Therefore, by reading the two-dimensional bar code (BC2) of each QFP to specify the identification number of the QFP it is possible to trace in an instant the manufacturing conditions of the QFP stored in the main server (MS). As a result, it is possible to investigate the cause of a defect if any of a QFP quickly and hence possible to rapidly take measures against the defect recurring by feedback of the cause of the defect to the manufacturing process.

The manufacturing method described above can be applied not only to an anti-defect measure for the QFPs shipped to customers, but also to a measure against defects occurring in the course of manufacture. More specifically, if a defect of a QFP is found out during manufacture of the QFP, then by reading the two-dimensional bar code (BC1) stamped to the lead frame LF concerned or by reading the two-dimensional bar code (BC2) stamped to the sealing body 10 concerned, it is possible to trace in an instant the manufacturing conditions in preceding steps of the semi-fabricated product with that identification number put thereto and investigate the cause of the defect quickly in the course of the manufacturing process.

Although in this embodiment reference has been made to QFP as an example of a semiconductor package which is assembled using a lead frame, it goes without saying that the present invention is applicable also to other semiconductor packages using a lead frame, e.g. QFN or TSSOP.

Second Embodiment

Figure 18:
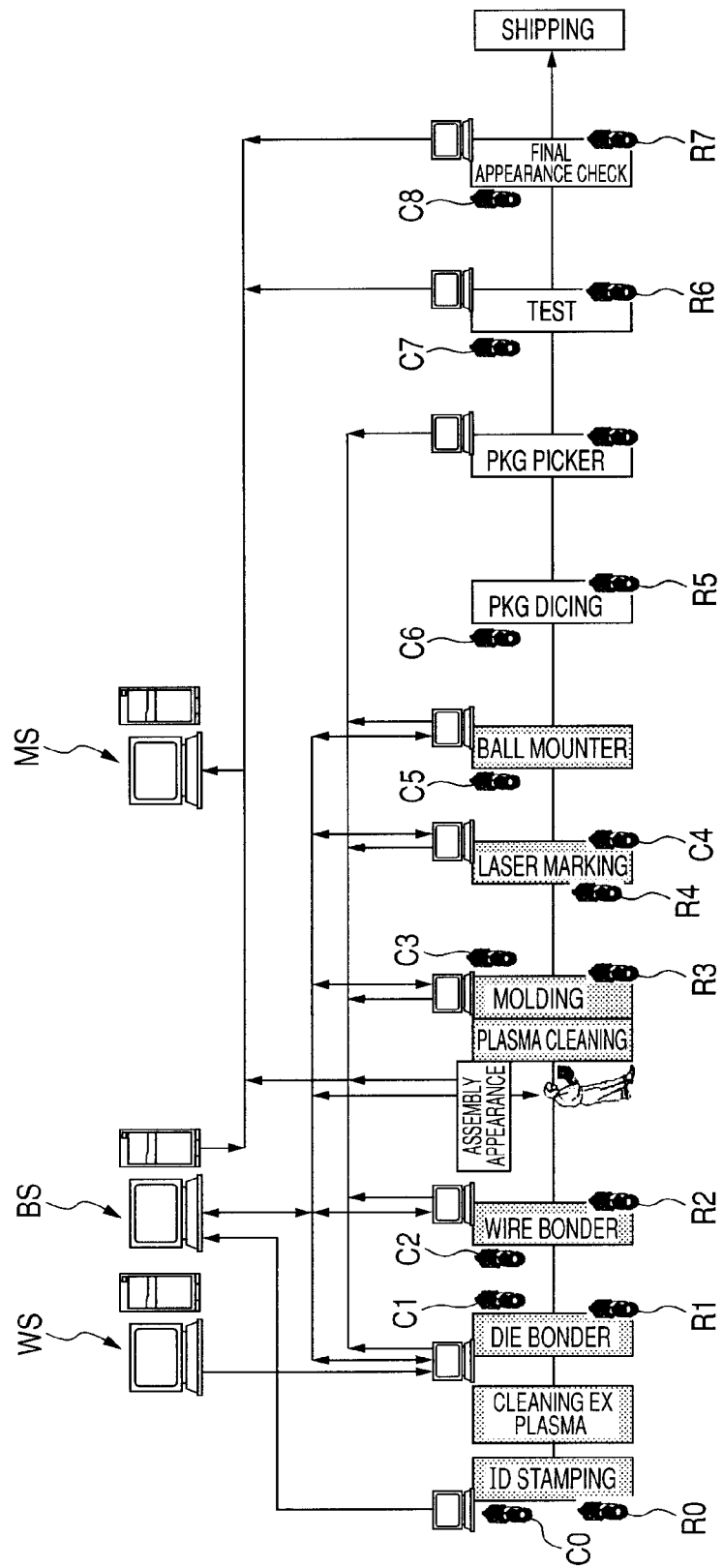
FIG. 18 is an entire flow chart showing a manufacturing process for a CSP according to a second embodiment of the present invention.

In this embodiment the present invention is applied to the manufacture of a CSP (Chip Size Package) which is a kind of a semiconductor package. FIG. 18 is an entire flow chart showing a manufacturing process for the CSP. As to the same contents, such as configuration, conditions and effects, as in the first embodiment, explanations thereof will be omitted.

Figure 19:
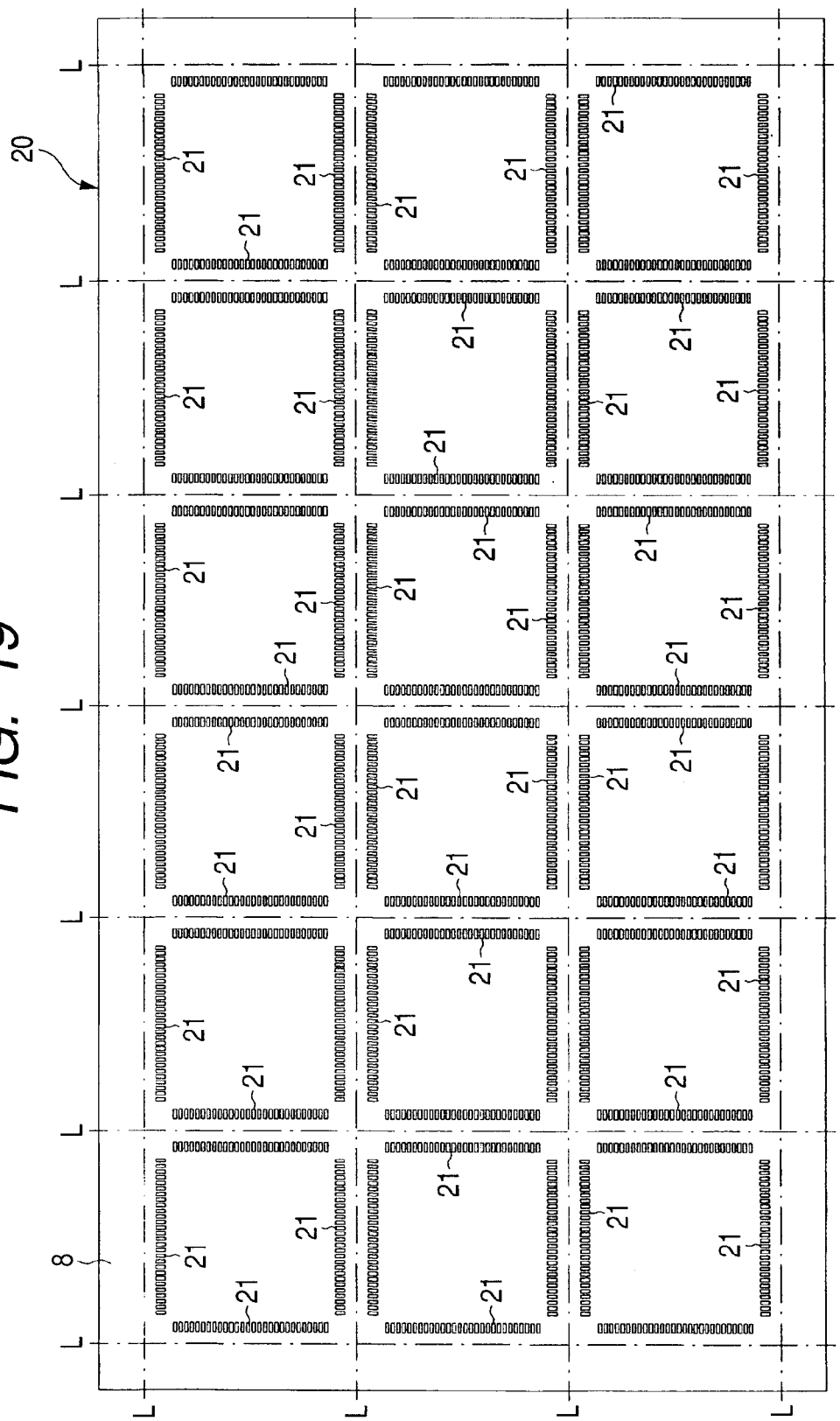
FIG. 19 is an entire plan view showing a surface of a map substrate used in manufacturing the CSP.
Figure 20:
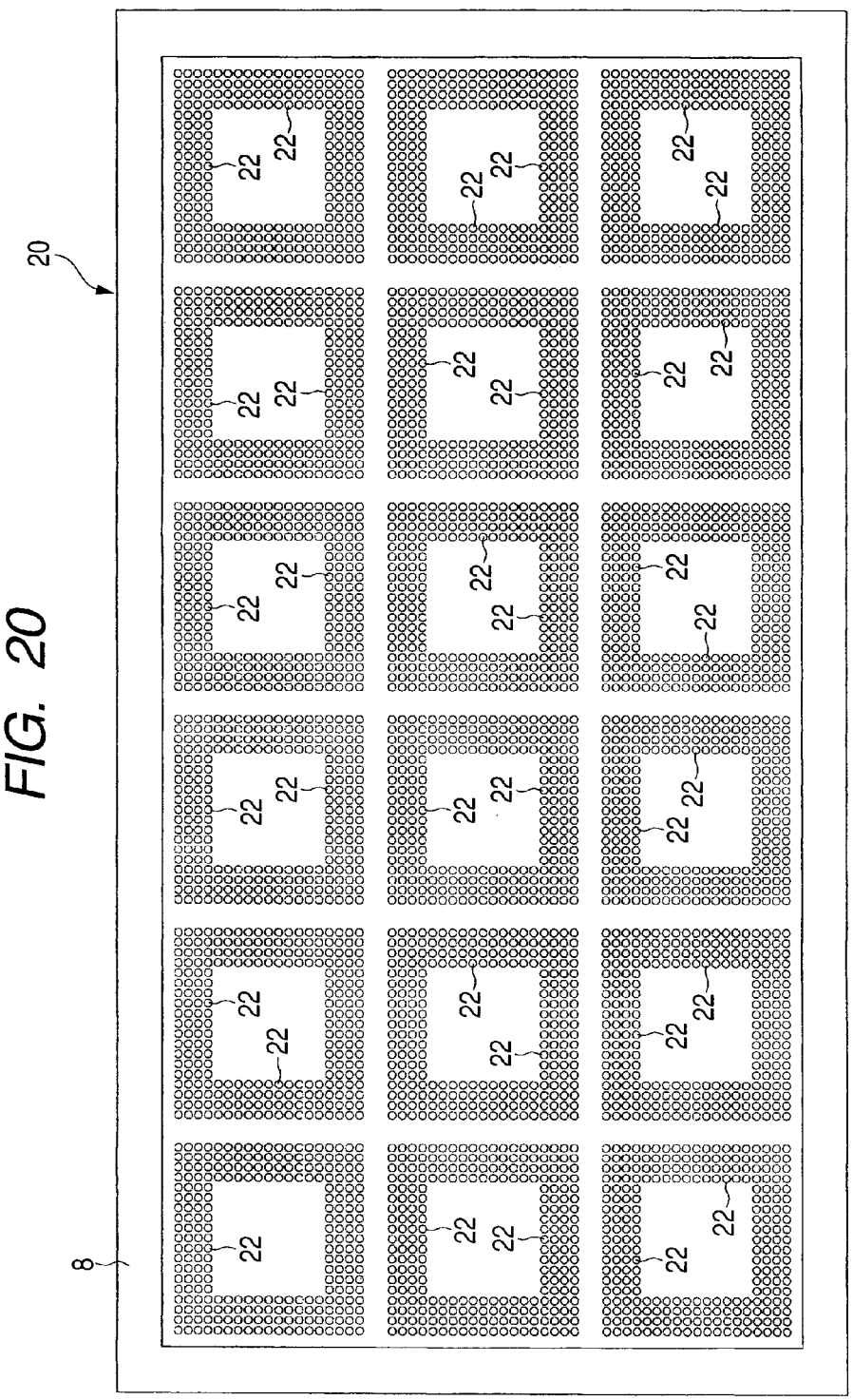
FIG. 20 is an entire plan view showing a back surface of the map substrate used in manufacturing the CSP.

For manufacturing the CSP, first as base members (chip mounting members), there are provided a wiring substrate (map substrate) 20 formed with a plurality of device areas such as that shown in FIGS. 19 and 20, as well as a semiconductor wafer. FIG. 19 is an entire plan view showing a surface (upper surface, main surface) of the map substrate 20 and FIG. 20 is an entire plan view showing a back surface (lower surface, packaging surface) of the map substrate 20.

<On Map Substrate>

The map substrate 20 is a large-sized wiring substrate which serves as a matrix of a wiring substrate 25 of the CSP to be described later. A plurality of wiring substrates 25 are obtained by dicing the map substrate 20 lattice-like along dicing lines L indicated by dot-dash lines in FIG. 19. Along the dicing lines L the map substrate 20 is partitioned in its long-side direction into six blocks and in its short-side direction into three blocks. Each of the blocks is an area which becomes one wiring substrate 25 after dicing the map substrate 20. Therefore, a total of 3×6=18 CSPs can be obtained from the map substrate 20.

A large number of conductor patterns are formed of copper (Cu) in each of the blocks of the map substrate 20. Of these conductor patterns, lands (electrode pads, bonding leads) 21 are illustrated in FIG. 19 and electrodes (electrode pads, bump lands) 22 are illustrated in FIG. 20. Though not shown, wiring lines coupled electrically to the lands 21 are formed on the surface of the map substrate 20. Those wiring lines are also coupled electrically to the electrodes 22 on the back surface of the map substrate 20 through conductive members (via lines) formed within via holes which pierce through the map substrate 20. The surface of the map substrate 20 is covered with an insulating film (solder resist) except the area where the lands 21 are formed. Likewise, the back surface of the map substrate 20 is covered with an insulating film (solder resist) except the area where the electrodes 22 are formed. Surfaces of the lands 21 and electrodes 22 are each formed with a plating layer which is a laminated layer of, for example, a nickel (Ni) layer and a gold (Au) layer stacked on the nickel layer.

<On Semiconductor Wafer>

The semiconductor wafer used in manufacturing the CSP is not specially limited, but it is for example the semiconductor wafer 1A (see FIG. 3) used in the first embodiment. As noted above, the semiconductor wafer 1A is divided into a large number of semiconductor chips 1. To each semiconductor chip 1 is put an identification number (ID) which includes information such as production lot number of the semiconductor wafer 1A, wafer number, the position of the semiconductor chip 1 in the semiconductor wafer 1A, and whether the semiconductor chip 1 is a non-defective product or a defective product. The chip identification number is managed by a server (wafer map data management server WS).

Next, a method for manufacturing the CSP according to this embodiment will be described below step by step while making reference to the entire flow chart of FIG. 18, as well as FIGS. 21 to 28.

<ID Stamping Step>

Figure 21:
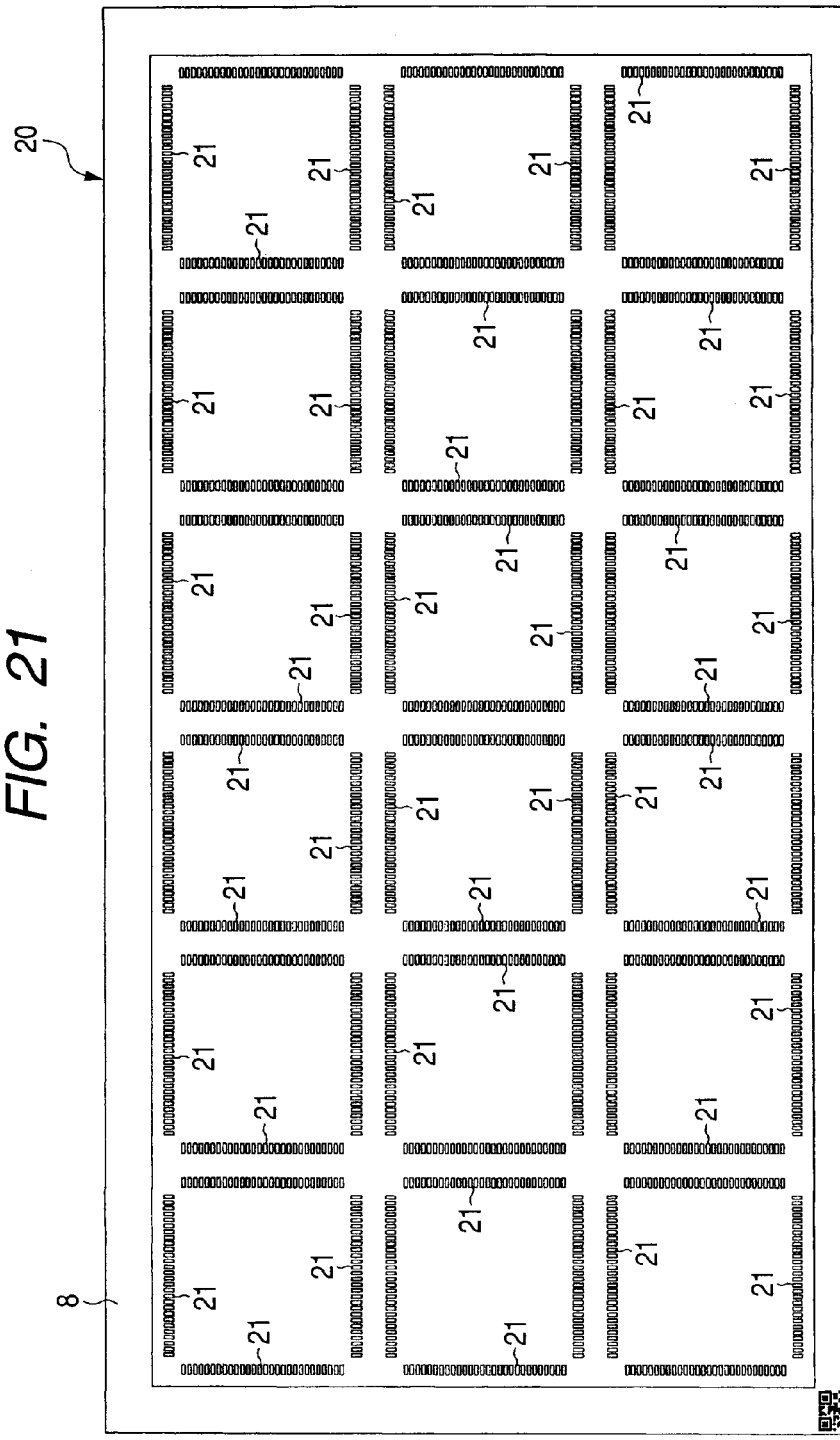
FIG. 21 is a plan view of the map substrate, showing an ID stamping step.

First, a predetermined number of map substrates shown in FIGS. 19 and 20 are provided. Then, as shown in FIG. 21, to a surface (upper surface, main surface) of an outer frame portion 8 of each map substrate 20 is stamped a two-dimensional bar code (BC3) corresponding to the identification number (ID) of the map substrate 20. As shown in FIGS. 19 to 26, the outer frame portion 8 of the map substrate 20 is an area located outside the foregoing eighteen blocks and outside each device area (an area where a sealing body 23 is formed) which will be described later.

For stamping the two-dimensional bar code (BC3) to the surface (upper surface, main surface) of the map substrate 20 there is used a laser beam (e.g., infrared light with a wavelength of about 1064 nm). Instead of stamping with a laser beam, for example a seal with the two-dimensional bar code (BC3) printed thereon may be affixed to the surface of the outer frame portion 8. Further, the same two-dimensional bar code (BC3) may be stamped to plural positions of the outer frame portion 8, or in the case where the area of the outer frame portion 8 is sufficiently wide, a one-dimensional bar code may be stamped in place of the two-dimensional bar code (BC3).

By thus stamping the identification number of the map substrate 20 in the form of a bar code it is possible to automate specifying of the identification number of the map substrate 20.

Next, using the bar code reader (R0) shown in FIG. 18, the two-dimensional bar code (BC3) stamped to each map substrate 20 is read and is stored in a map substrate data management server (BS). Now, preparations for recording the conditions in each step applied to the base members corresponding to various identification numbers are completed in the map substrate data management server (BS).

Moreover, each map substrate 20 is subjected to an appearance check by image recognition using the camera (C0). If a defect of a map substrate is detected, correlation is made between the identification number of the map substrate and the defective block and the information thus obtained is stored in the map substrate data management server (BS).

Thereafter, the surface of each map substrate 20 is subjected to plasma cleaning or chemical cleaning to clean the surfaces of the lands 21 and electrodes 22. This is because, as noted above, an insulating film (solder resist) is formed on the surface of the map substrate 20 and a contaminant (outgas) is produced from the insulating film under the influence of heat which is induced by the radiation of a laser beam to the base member (map substrate 20). In this embodiment, therefore, a step for cleaning the base member is provided after the ID stamping step and before the die bonding step.

<Die Bonding Step>

Figure 22:
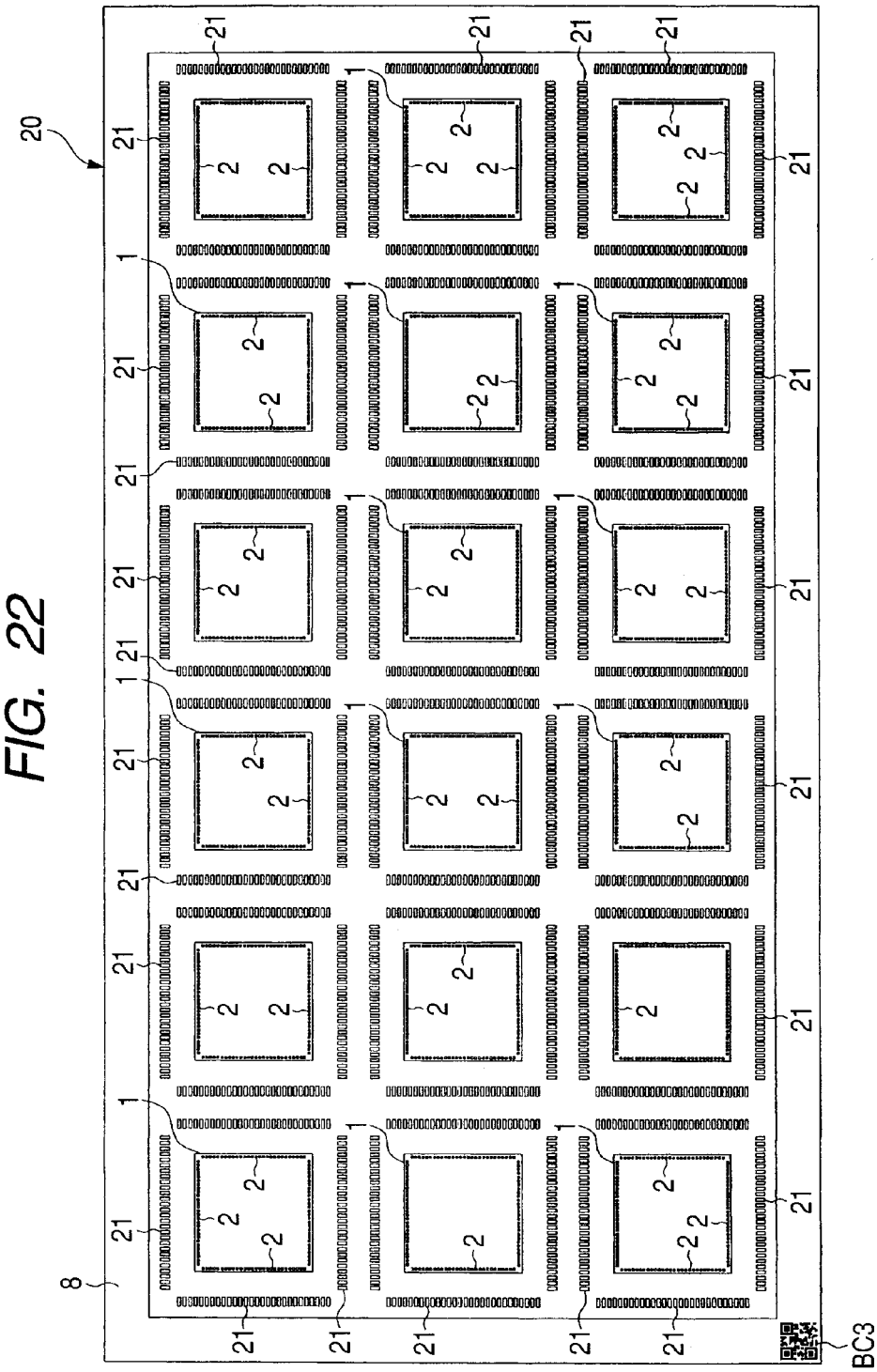
FIG. 22 is a plan view of the map substrate, showing a die bonding step.

Next, the map substrate 20 with the two-dimensional bar code (BC3) stamped thereon is conveyed to an apparatus (die bonding apparatus) used in a die bonding step. Then, an adhesive (not shown) is supplied block by block to the surface of the map substrate 20. Thereafter, as shown in FIG. 22, semiconductor chips 1 obtained from the semiconductor wafer 1A shown in FIG. 3 are picked up one by one and each semiconductor chip thus picked up is mounted onto each block (chip mounting area).

When mounting the semiconductor chip 1 onto each block (chip mounting area) of the map substrate 20, there is made alignment between the semiconductor chip 1 and the block with use of the position recognizing camera (C1) shown in FIG. 18. Moreover, the two-dimensional bar code (BC3) stamped to the map substrate 20 is read using the bar code reader (R1), and out of the pieces of base member information (pieces of intra-server information) which were stored in the server (map substrate data management server BS) in a previous step (ID stamping step), the identification number corresponding to the map substrate 20 recognized by the bar code reader (R1) in the die bonding apparatus is drawn out from the interior of the server. Then, a check is made to see if there is any defect in part of the map substrate 20 thus recognized. As a result, if there is a defect in part of the map substrate 20 corresponding to the identification number, the semiconductor chip 1 is not mounted onto the block including the defect.

When mounting a semiconductor chip 1 onto each block of the map substrate, reference is made to the identification number of the semiconductor chip 1 stored in the wafer map data management server (WS) and a check is made to see whether the semiconductor chip 1 corresponding to the identification number is a non-defective product or a defective product. If the semiconductor chip 1 is a defective product, it is not mounted onto the map substrate 20.

Next, correlation is made between the identification number of the map substrate 20 obtained from the two-dimensional bar code (BC3) and the identification number of the semiconductor chip 1 mounted onto the map substrate 20 and the information thus obtained is stored in the server (main server MS). Further, correlation is made between the conditions (e.g., model number of the die bonding apparatus used and the kind of the adhesive) used at the time of mounting the semiconductor chip 1 onto the map substrate 20 and the identification number of the map substrate 20, and the information thus obtained is stored in the main server (MS).

In this way the semiconductor chip 1 is mounted onto each block of the map substrate 20 and correlation is made between the identification number of each map substrate and the identification number of the semiconductor chip 1 thus mounted on each map substrate 20, then the information thus obtained is stored in the main server (MS). Further, correlation is made between the conditions used at the time of mounting the semiconductor chip 1 onto each block of each map substrate 20 and the identification number of each map substrate 20, then the information thus obtained is stored in the main server (MS).

<Wire Bonding Step>

Figure 23:
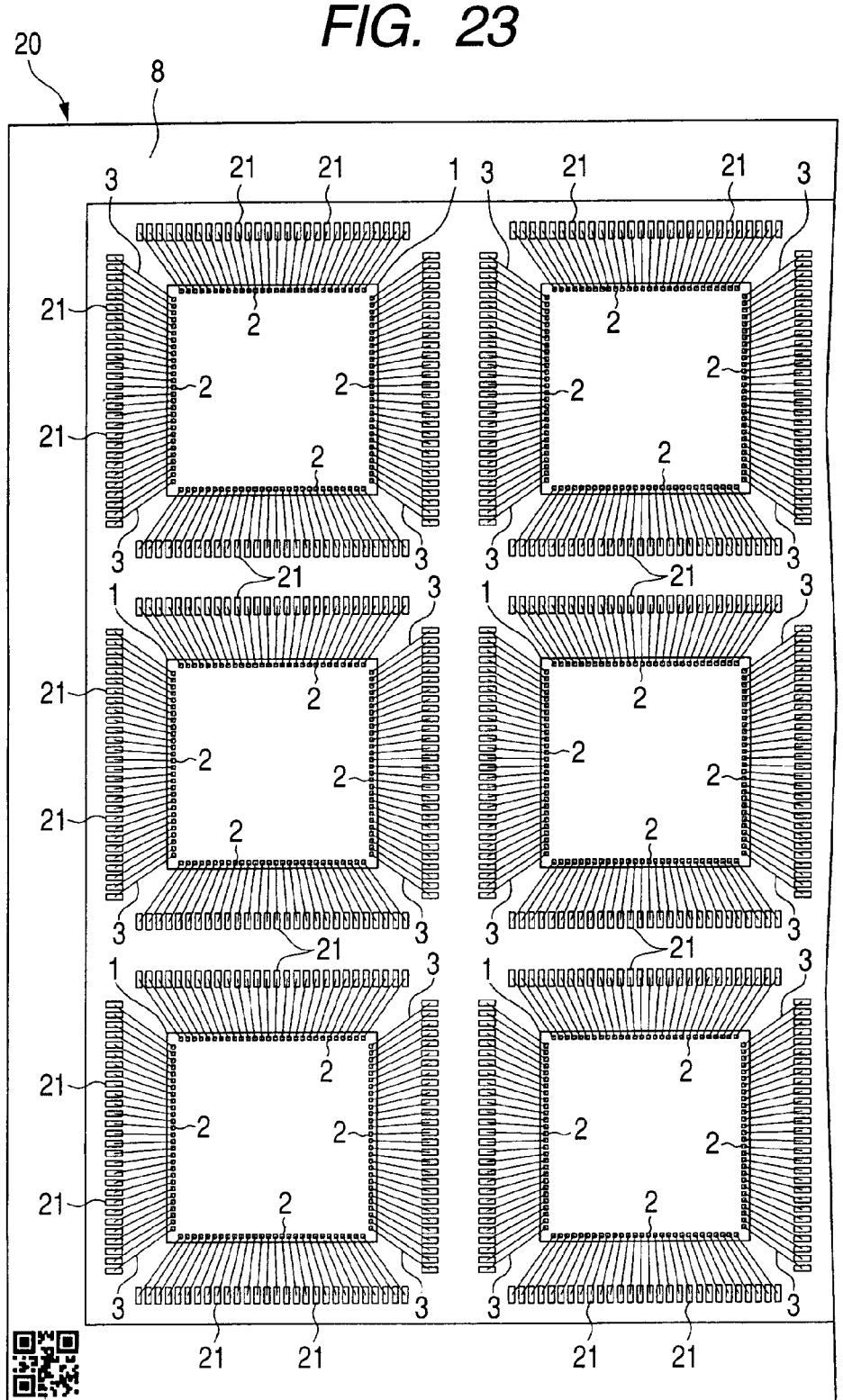
FIG. 23 is a partially enlarged plan view of the map substrate, showing a wire bonding step.

Next, the map substrate 20 having gone through the above die bonding step is conveyed to an apparatus (wire bonding apparatus) used in a wire bonding step. Then, the map substrate 20 is established in position onto a stage of the wiring bonding apparatus. Thereafter, as shown in FIG. 23 (a plan view showing a part of the map substrate 20 on a larger scale), the bonding pads 2 of the semiconductor chips 1 and the lands 21 of the map substrate 20 are coupled together electrically through conductive members 3. The conductive members 3 used in this embodiment are gold (Au) wires like those used in the first embodiment.

Next, the two-dimensional bar code (BC3) stamped to the map substrate 20 is read using the bar code reader (R2), and out of the pieces of base member information (pieces of intra-server information) stored in the map substrate data management server BS in a previous step (ID stamping step), the identification number corresponding to the map substrate 20 recognized by the bar code reader (R2) is drawn out from the interior of the server. Then, a check is made to see if there is a defect in part of the recognized map substrate 20. As a result, if a defect is found in part of the map substrate 20 corresponding to the identification number concerned, wires 3 are not bonded to the lands 21 in the block including the defect.

Then, correlation is made between bonding conditions (e.g., model number of the wire bonding apparatus used and the diameter of each wire 3) for the wires 3 and the identification number of the map substrate 20 obtained from the two-dimensional bar code (BC3) and the information thus obtained is stored in the main server (MS).

In this way the bonding pads 2 of the semiconductor chips 1 mounted on each map substrate 20 and the lands 21 are coupled together electrically and correlation is made between the bonding conditions for the wires 3 and the identification number of each map substrate 20, then the information thus obtained is stored in the main server (MS).

Thereafter, each map substrate 20 is subjected to an appearance check to check the wires 3 for breaking or short-circuit. In the event a defect is detected, correlation is made between the identification number of the associated map substrate 20 obtained from the two-dimensional bar code (BC3) and the block including the defect and the information thus obtained is stored in the map substrate data management server (BS).

<Molding Step>

Next, the surface of the map substrate 20 having gone through the wire bonding step (or the appearance check) is subjected to plasma cleaning and thereafter the map substrate is conveyed to an apparatus used in a molding step. Then, the map substrate 20 is disposed within a mold (not shown) of the molding apparatus and, where required, the two-dimensional bar code (BC3) stamped to the map substrate 20 is read using molding apparatus recognizing means (bar code reader R3), then out of the pieces of base member information (pieces of intra-server information) stored in the server (map substrate data management server BS) in a previous step, the identification number corresponding to the map substrate 20 recognized by the bar code reader (R3) in the molding apparatus is drawn out from the interior of the server.

Figure 24:
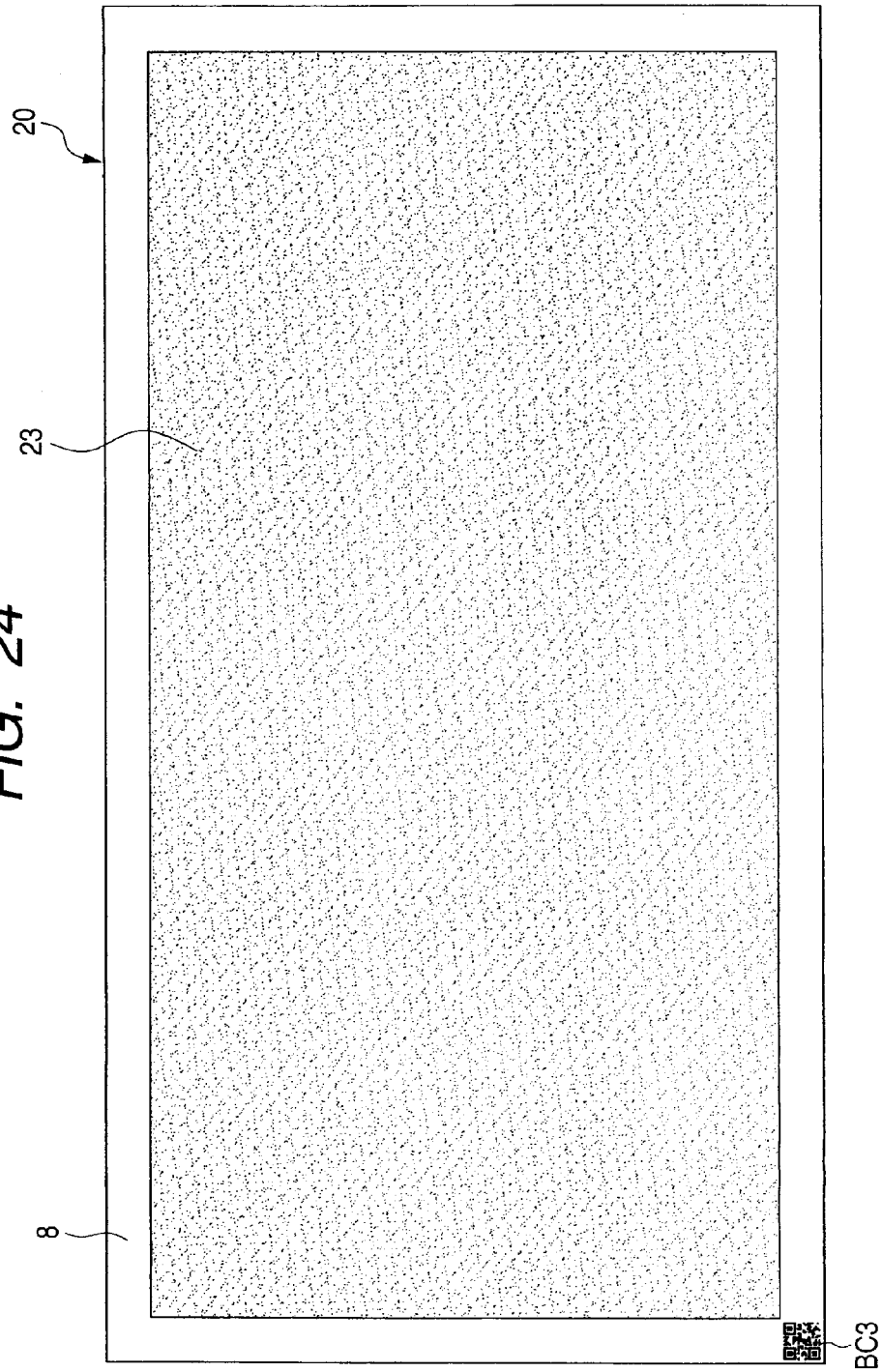
FIG. 24 is a plan view of the map substrate, showing a molding step.
Figure 25:
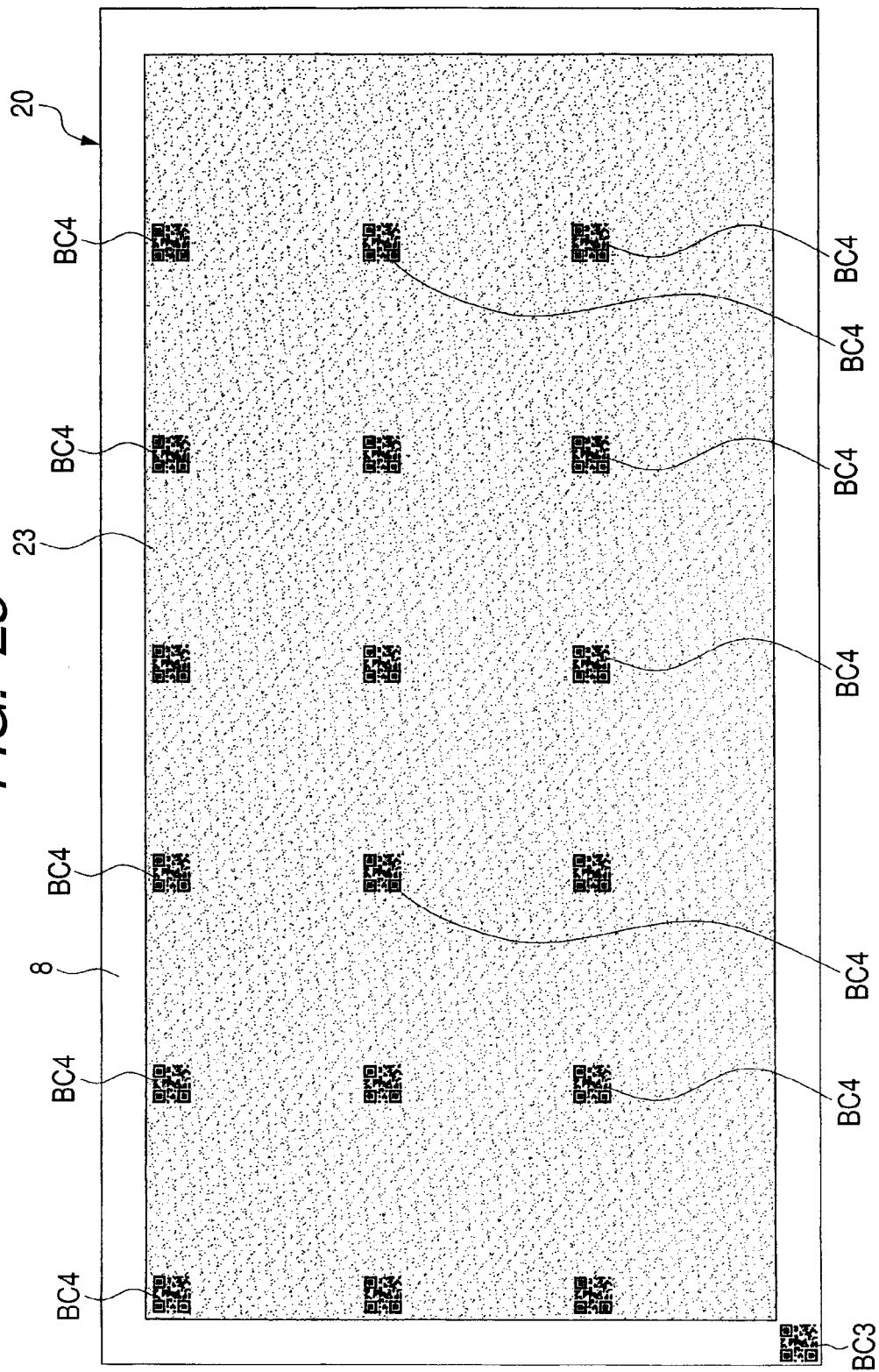
FIG. 25 is a plan view of the map substrate, showing a laser marking step.

Then, as shown in FIG. 24, the semiconductor chips 1, wires 3 and lands 21 are sealed with molding resin to form a sealing body (resin sealing body) 23. At this time, the device areas (the semiconductor chips 1 mounted in the device areas) are sealed with resin such that the identification number (two-dimensional bar code BC3) formed on the outer frame portion 8 is exposed to the exterior of the sealing body 23. Further, the filling performance of the resin is monitored using the camera (C3) shown in FIG. 18. In this molding step, the semiconductor chips 1, wires 3 and lands 21 are sealed not block by block, but all the blocks are sealed at a time with resin. Consequently, the whole surface of the map substrate 20 except the outer frame portion 8 is covered with the sealing body 23.

Next, the two-dimensional bar code (BC3) stamped to the outer frame portion 8 of the map substrate is read using the bar code reader (R3), thereafter, correlation is made between molding conditions (e.g., model number of the molding apparatus used and the kind of the sealing body 23) and the identification number of the map substrate 20 and the information thus obtained is stored in the main server (MS).

In this way each map substrate 20 is loaded to the mold of the molding apparatus and the semiconductor chips 1, wires 3 and lands 21 are sealed with resin. Further, correlation is made between the molding conditions and the identification number of each map substrate 20 and the information thus obtained is stored in the main server (MS).

<Laser Marking Step>

Next, each map substrate 20 is put into a single wafer baking oven, allowing the sealing body to cure completely, and is then conveyed to an apparatus used in a laser marking step, in which two-dimensional bar codes (BC4) are stamped block by block to the surface of the sealing body 23.

In this step of forming the two-dimensional bar codes (BC4), first the two-dimensional bar code (BC3) stamped to the outer frame portion 8 of the map substrate 20 is read using the bar code reader (R4) in the laser marking apparatus. Then, out of the pieces of base member information (pieces of intra-server information) stored in the map substrate data management server (BS) in a previous step, information (e.g., intra-server information, chip position information, wafer production lot number, semiconductor wafer number, assembly lot number, and product model name) corresponding to the map substrate 20 recognized by the bar code reader (R4) is drawn out from the interior of the server. The information thus drawn out is formed as a new identification number (two-dimensional bar code BC4) on the surface side of the sealing body 23. When stamping the two-dimensional bar codes (BC4) to the surface of the sealing body 23, marks (not shown) of product information (e.g., product model name, customer logo mark, and production code) are also stamped.

As to the information stored in the two-dimensional bar codes (BC4) formed on the surface of the sealing body 23, it is possible to selectively call the information managed by the server and let it be stored in the two-dimensional bar codes, with no limitation made to the foregoing information. Therefore, the information stored in the two-dimensional bar codes (BC4) may be the same information as the two-dimensional bar code (BC3) stamped to the outer frame portion 8 of the map substrate 20. In this case, after recognition using the bar code reader, by collating the information of the corresponding map substrate 20 from among the pieces of base member information stored in the map substrate data management server (BS), it is possible to draw out each of the above pieces of information. In this embodiment, the conditions for the laser used in the laser marking step are the same as those used in the ID stamping step, but no limitation is made thereto. Moreover, the method for forming the two-dimensional bar codes (BC4) is not limited to the method using a laser beam. For example, seals having the two-dimensional bar codes (BC4) printed thereon respectively may be affixed to the surface of the sealing body 23.

Figure 26:
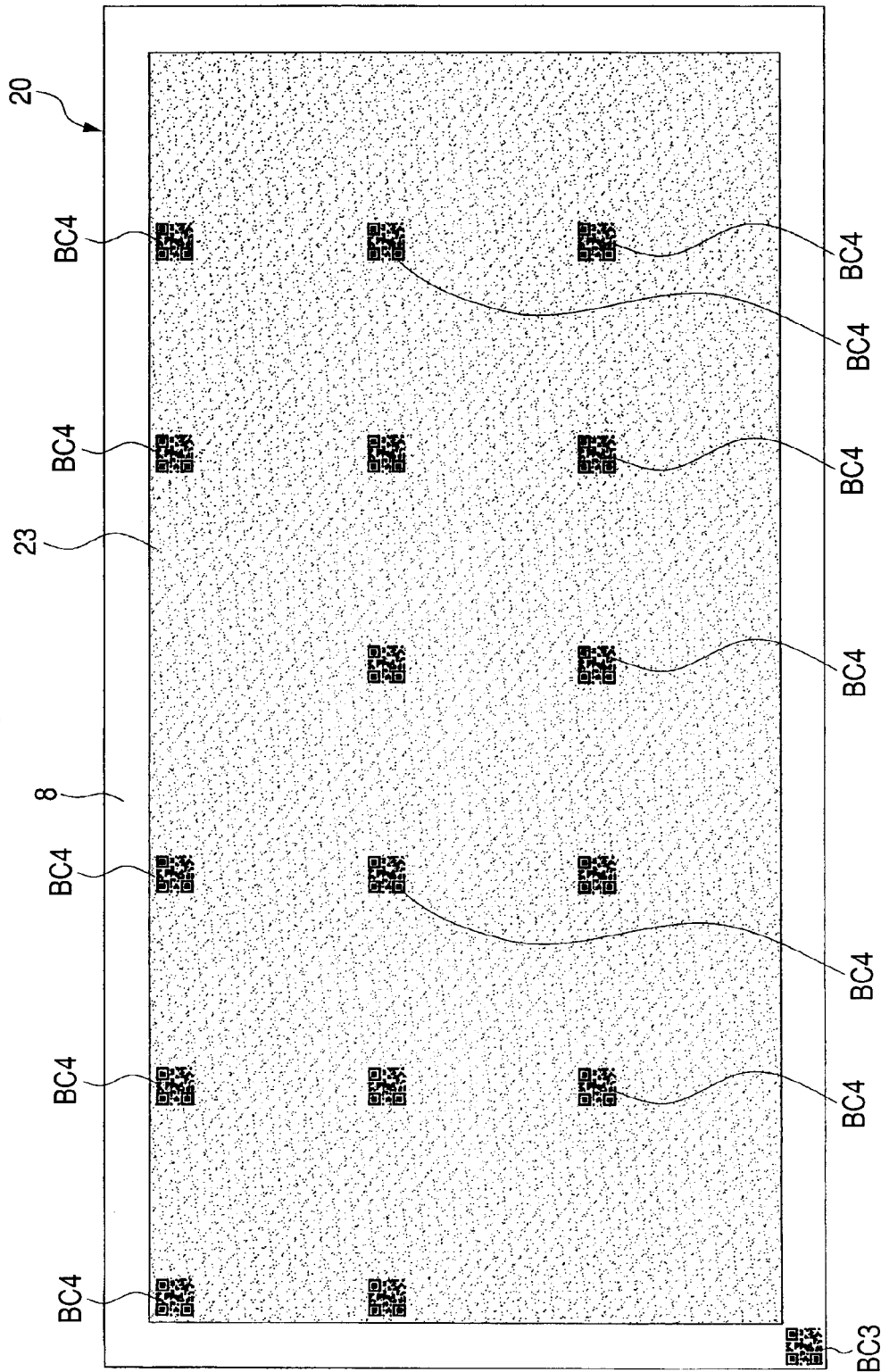
FIG. 26 is a plan view of the map substrate, showing another example of a laser marking step.

When stamping the two-dimensional bar codes (BC4) and marks, reference is made to the map substrate data management server (BS) and a check is made to see if a defect has occurred in part of the map substrate 20 in any of the past steps. If defects are found in part of the map substrate 20, the two-dimensional bar code (BC4) and marks are not stamped to the blocks including the defects, as shown in FIG. 26.

Then, using the camera (C4), a check is made block by block to see if the two-dimensional bar code (BC4) and marks have been stamped positively and the result of the check is stored in the main server (MS) while being correlated with the identification number of the map substrate 20 concerned.

<Ball Mounting Step>

Figure 27:
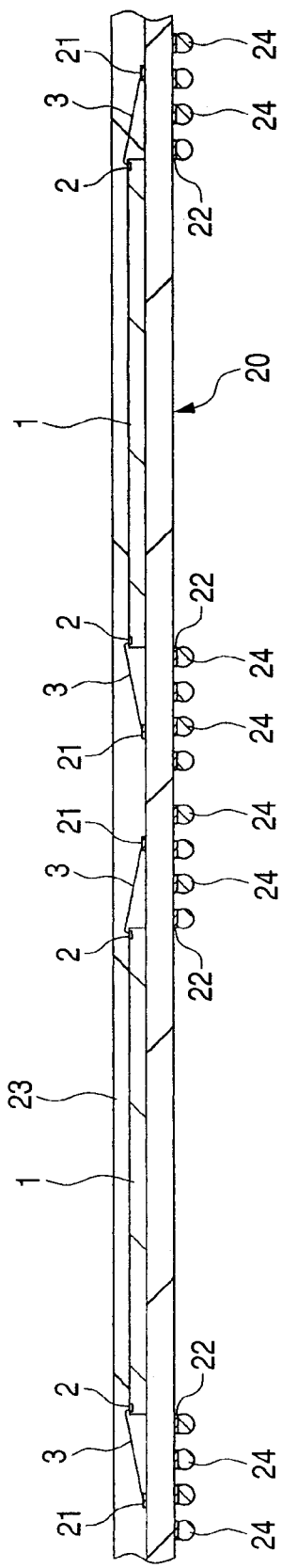
FIG. 27 is a partial sectional view of the map substrate, showing a ball mounting step.

Next, the map substrate 20 having gone through the stamping step of the two-dimensional bar codes (BC4) and marks is conveyed to a ball mounting step. Then, as shown in FIG. 27, solder bumps (ball electrodes) 24 as external coupling terminals of the CSP are coupled to electrodes 22 formed on the back surface of the map substrate 20. In this case, a state of coupling between the electrodes 22 and the solder bumps 24 is checked using the camera (C5) shown in FIG. 18 and the result of the check is stored in the main server (MS) while being correlated with the identification number of the map substrate 20 concerned.

<Dicing Step>

Figure 28:
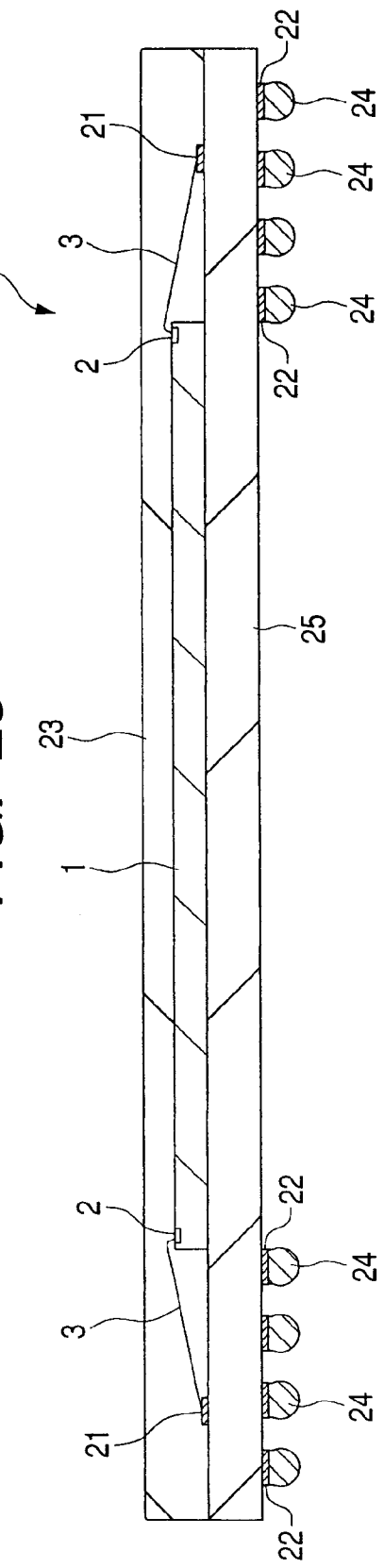
FIG. 28 is a sectional view showing a completed state of the CSP.

Next, the map substrate 20 after completion of the coupling of solder bumps 24 is conveyed to a dicing step, in which it is diced along the dicing lines L shown in FIG. 19. When dicing the map substrate 20, there is made alignment between a dicing blade and the map substrate 20 with use of the camera (C6) shown in FIG. 18. In this way, as shown in FIG. 28, there is completed a CSP wherein the semiconductor chip 1 mounted on the upper surface of the wiring substrate 24 is sealed with the sealing body 23 and with solder bumps 24 coupled to the back surface of the wiring substrate 25.

Then, the two-dimensional bar code (BC4) of each CSP is read using the bar code reader (R5) shown in FIG. 18. Further, the CSP with the two-dimensional bar code (BC4) not stamped to the surface of the sealing body 23 is removed as a defective product and only the CSPs determined to be non-defective products are picked up and stored on a tray.

<Testing Step>

Next, the CSPs thus stored as non-defective products onto the tray are conveyed to a testing step and are each loaded into a socket with use of the camera (C7) shown in FIG. 18, then are subjected to a burn-in test and an electrical characteristic test. Subsequently, the two-dimensional bar code (BC4) of each CSP is read using the bar code reader (R6). Then, correlation is made between the test result and the identification number of each CSP and the information thus obtained is stored in the main server (MS).

<Final Appearance Checking Step>

Next, the CSPs determined to be non-defective products in the above testing step are conveyed to a final appearance checking step. In this step, a state of coupling of solder bumps 24 is checked by image recognition using the camera (C8) shown in FIG. 18 and thereafter the two-dimensional bar code (BC4) of each CSP is read using the bar code reader (R7). Then, correlation is made between the result of the checking and the identification number of each CSP and the information thus obtained is stored in the main server (MS).

The CSPs thus manufactured through the various steps described above are shipped from the manufacturer to a customer, in which they are each mounted for use onto a predetermined wiring substrate. The state of shipping from the manufacturer to the customer is managed while being correlated with the above two-dimensional bar code (BC4).

In this embodiment, the identification number (ID, two-dimensional bar code) is stamped to the outer frame portion 8 of the map substrate 20 and is read in the molding step.

Further, out of the pieces of information (pieces of intra-server information) stored in the map substrate data management server (BS), the information (intra-server information) corresponding to the read identification number (first identification number) of the base member is encrypted as a new identification number (ID, two-dimensional bar code) and the encrypted identification number (second identification number) is put (formed) to the sealing body 23.

In the event of occurrence of a defect in a completed semiconductor device (CSP) after shipping, the manufacturer specifies the identification number of the CSP by reading the two-dimensional bar code (BC4) stamped to the sealing body 23 of the defective CSP with use of a bar code reader.

Pre-process information, such as from which product lot of semiconductor wafer the semiconductor chip sealed to the CSP concerned was obtained and at which position of the semiconductor wafer the semiconductor chip was located, is stored in the manufacturer's main server (MS) in correlation with the identification number of the CSP. Post-process information, such as what conditions were adopted in the above die bonding, wire bonding, molding, laser marking, ball mounting and dicing steps to manufacture the CSP concerned, is also stored in the manufacturer's main server in correlation with the identification number of the CSP.

Thus, by reading the two-dimensional bar code (BC4) of each CSP and thereby specifying the identification number of the CSP it is possible to trace in an instant the manufacturing conditions for the CSP stored in the main server (MS). Thus, the cause of the CSP defect can be investigated quickly, so that by feeding back the cause of the defect to the manufacturing process it is possible to rapidly take measures against the defect recurring.

Although the present invention has been described above concretely by way of embodiments thereof, it goes without saying that the present invention is not limited to the above embodiments, but that various changes may be made within the scope not departing from the gist of the invention.

Although in the first and second embodiments described above the semiconductor chips are mounted onto the chip mounting areas of the base member in accordance with the wire bonding method, the mounting of the semiconductor chips may also be done by a flip-chip method using bump electrodes as conductive members.

Although in the above embodiments a lead frame and a large-sized wiring substrate (map substrate) were used as examples of base members (chip mounting members), a TAB tape or a flexible wiring substrate is also employable as the base member.

Although in the above first and second embodiments a laser was used to stamp the identification number (ID) to the base member and the sealing body, there may be adopted a method which performs the stamping with use of a mold having such an end face as has a shape (two-dimensional bar code) corresponding to the identification number (ID) or a method wherein a seal with the identification number (ID) printed thereon is affixed to the base member and the sealing body. However, since the shape of the identification number (ID) differs for each base member, the method using a mold requires the provision of a mold corresponding to each base member (lead frame, wiring substrate). In the method wherein a seal is affixed to the base member, there is a fear of peeling-off of the seal because a heating step for the base member is included in the post-process. Therefore, as a method for forming the identification number (ID) it is preferable to use a laser as in the above embodiments.

Although in the above first and second embodiments the identification number (ID, two-dimensional bar code) is stamped to the base member and the sealing body with use of a laser, the identification number may be printed using special luminous ink adapted to emit light only when irradiated with an electric illuminant (black light) which is filtered so as to emit only specific UV light (ultraviolet light). This printing method is an effective means in printing a two-dimensional bar code having information which is not to be made public carelessly. As noted above, however, the plating step in the first embodiment follows the laser marking step, so there is a fear that the printed special luminous ink may be dissolved in the plating solution. For this reason it is preferable that the identification number (ID, two-dimensional bar code) be formed using a laser.

Although in the above first and second embodiments the semiconductor chips 1 are mounted after the supply of an adhesive to the surfaces of the chip mounting areas, there may be adopted a method wherein a filmy adhesive layer is formed beforehand on the back surface of each semiconductor chip 1 (semiconductor wafer 1A) and then the semiconductor chip 1 is mounted onto the chip mounting area through the adhesive layer.

Although in the above first and second embodiments die bonding is performed in the die bonding step after making reference to the identification information of the semiconductor chips stored in the wafer map data management server (WS), there may be adopted another means. For example, according to another means for determining whether each semiconductor chip 1 is a non-defective or defective product, a defect mark is formed on a defective product among the semiconductor chips 1 formed on the semiconductor wafer 1A. Next, in the die bonding step, if this defect mark is recognized imagewise by the camera (C1) provided in the die bonding apparatus, the defective product is skipped and only non-defective semiconductor chips are mounted onto the respective chip mounting areas. Then, in this die bonding step, a chip identification number (ID) is generated while making correlation with position information of the semiconductor chip 1 concerned in the semiconductor wafer 1A, information on non-defective and defective products, production lot number of the wafer and semiconductor wafer number, and is stored in the wafer map data management server (WS). The correlated information of both chip identification number (ID) and the identification number of the base member (lead frame, wiring substrate) is also stored in the main server (MS). In this way, even after completion of the semiconductor device, it is possible to easily specify in which production lot a semiconductor chip 1 disposed within the sealing body was manufactured and in which semiconductor wafer and at which position the semiconductor chip 1 was located, by making reference to the identification number formed on the surface of the sealing body or by making reference to both the said identification number and the information stored in the main server (MS).

Although in the above embodiments it has been described that various pieces of information in the manufacturing process can be read by making reference to the identification number (ID, two-dimensional bar code) formed on the sealing body, the said identification number may be utilized as an index mark. In case of using the identification number as an index mark, it is possible to omit the step for forming the index mark separately from the identification number.

The present invention is applicable to the management of defects generated in a semiconductor product manufacturing process.

What is claimed is:

1. A method of manufacturing a semiconductor device, comprising the steps of:
   (a) providing a base material including a device area having a chip mounting portion, and an outer frame portion located around the device area;
   (b) after the step (a), putting a first identification number to the outer frame portion of the base material;
   (c) after the step (b), mounting a semiconductor chip on the chip mounting portion of the base material;
   (d) after the step (c), sealing the semiconductor chip with resin such that the outer frame portion is exposed from the resin, thereby forming a sealing body; and
   (e) after the step (d), reading the first identification number, and putting a first piece of intra-server information as a second identification number to the sealing body, the first piece of intra-server information of a plural pieces of intra-server information stored in a server corresponding to the read first identification number;
   wherein the step (c) is performed by the following steps (c1)-(c4):
      (c1) reading the first identification number of the base material, conveyed to a first apparatus, with a first recognition tool of the first apparatus,
      (c2) after the step (c1), retrieving a first piece of intra-server information of the plural pieces of intra-server information stored in the server, corresponding to the read first identification number,
      (c3) after the step (c2), mounting the semiconductor chip on the chip mounting portion of the base material, and
      (c4) after the step (c3), storing the first piece of intra-server information corrected by correlating the first piece of intra-server information with manufacturing condition of the step (c);
   wherein the step (d) is performed by the following steps (d1)-(d4):
      (d1) reading the first identification number of the base material, conveyed to a second apparatus, with a second recognition tool of the second apparatus,
      (d2) after the step (d1), retrieving the first piece of intra-server information of the plural pieces of intra-server information stored in the server, corresponding to the read first identification number and corrected before this step (d2),
      (d3) after the step (d2), sealing the semiconductor chip with the resin, and
      (d4) after the step (d3), storing the first piece of intra-server information corrected by correlating the first piece of intra-server information with manufacturing condition of the step (d); and
   wherein the step (e) is performed by following steps (e1)-(e2),
      (e1) reading the first identification number of the base material, conveyed to a third apparatus, with a third recognition tool of the third apparatus, and
      (e2) after the step (e1), putting the first piece of intra-server information, of the plural pieces of intra-server information stored in the server, corresponding to the read first identification number and corrected before this step (e2), to the sealing body as the second identification number.

2. The method according to claim 1, wherein the base material is comprised of a wiring substrate including a surface on which a solder resist is formed;
   wherein in the step (b), the first identification number is marked by irradiating the outer frame portion of the base material with a laser beam; and wherein after the step (b), and before the step (c), the wiring substrate is cleaned.

3. The method according to claim 2, wherein each of the first identification number and the second identification number is a two-dimensional bar code.

4. A method of manufacturing a semiconductor device, comprising the steps of:
  (a) providing a lead frame including a device area having a chip mounting portion, an outer frame portion located around the device area, and a first identification number marked on the outer frame portion;
  (b) after the step (a), mounting a semiconductor chip on the chip mounting portion of the lead frame;
  (c) after the step (b), sealing the semiconductor chip with resin to form a sealing body, with at least a portion of the outer frame portion protruding from the sealing body and the first identification number on the outer frame portion being exposed;
  (d) after the step (c), marking a second identification number updated based on the first identification number on a surface of the sealing body; and
  (e) after the step (d), forming a plating film on a surface of the outer frame portion which protrudes from the sealing body.

5. The method according to claim 4, wherein each of the first identification number and the second identification number is a two-dimensional bar code.

6. The method according to claim 4, wherein in step (e), the plating film is deposited within grooves of the first identification number on the outer frame portion.

7. The method according to claim 5, wherein:
  a plurality of semiconductor chips are mounted on a common lead frame, each semiconductor chip being mounted in a corresponding device area and having its own sealing body, the method further comprising:
  (f) separating the sealing bodies from one another only after all of steps (a)-(e) have been completed.

8. A method of manufacturing semiconductor devices, comprising the steps of:
  (a) providing a lead frame having a plurality of device areas, each device area having a chip mounting portion, an outer frame portion located around the plurality of device areas, and a first identification number marked on the outer frame portion of the lead frame;
  (b) after the step (a), mounting a semiconductor chip on the chip mounting portion of at least some of the device areas of the lead frame;
  (c) after the step (b), sealing at least some of the mounted semiconductor chips with resin to form a sealing body around each such sealed mounted semiconductor chip, with at least a portion of the outer frame portion protruding from the sealing bodies and the first identification number exposed;
  (d) after the step (c), marking a second identification number updated based on the first identification number on a surface of at least some of the sealing bodies; and
  (e) after the step (d), forming a plating film on a surface of the lead frame which protrudes from the sealing bodies; and
  (f) after the step (e), separating the sealing bodies from one another.

9. The method according to claim 8, wherein each of the first identification number and the second identification number is a two-dimensional bar code.

10. The method according to claim 8, wherein in step (e), the plating film is deposited within grooves of the first identification number on the outer frame portion.

11. The method according to claim 8, comprising:
  in the step (b), reading the first identification number from the outer frame portion, and mounting a semiconductor chip on the chip mounting portion of the corresponding device area, only if information corresponding to the first identification number indicates that there is no defect.

12. The method according to claim 8, comprising:
  after the step (b) and before the step (c), wire bonding bonding pads of the semiconductor chip mounted on the chip mounting portion, to leads of the device area, only if information corresponding to the first identification number indicates that there is no defect.

13. The method according to claim 8, comprising:
  in the step (d), reading the first identification number from the outer frame portion, and marking the sealing body with the second identification number, only if information corresponding to the first identification number indicates that there is no defect.

14. The method according to claim 8, comprising:
  (g) after the step (f), checking to see if a second identification number has been put on each of the sealing bodies, and removing each semiconductor device as a defective product, if its corresponding sealing body is not marked with a second identification number.

15. The method according to claim 8, comprising:
  in the step (b), reading the first identification number from the outer frame portion, and mounting a semiconductor chip on the chip mounting portion of the corresponding device area, only if information corresponding to the first identification number indicates that there is no defect;
  after the step (b) and before the step (c), wire bonding bonding pads of the semiconductor chip mounted on the chip mounting portion, to leads of the device area, only if information corresponding to the first identification number indicates that there is no defect;
  in the step (d), reading the first identification number from the outer frame portion, and marking the sealing body with the second identification number, only if information corresponding to the first identification number indicates that there is no defect; and
  (g) after the step (f), checking to see if a second identification number has been put on each of the sealing bodies, and removing each semiconductor device as a defective product, if its corresponding sealing body is not marked with a second identification number.

* * * * *